(12) United States Patent
Hinoue

(10) Patent No.: US 11,968,827 B2
(45) Date of Patent: Apr. 23, 2024

(54) THREE-DIMENSIONAL MEMORY DEVICE WITH REPLACEMENT SELECT GATE ELECTRODES AND METHODS OF MANUFACTURING THE SAME

(71) Applicant: SANDISK TECHNOLOGIES LLC, Addison, TX (US)

(72) Inventor: Tatsuya Hinoue, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 280 days.

(21) Appl. No.: 17/465,131

(22) Filed: Sep. 2, 2021

(65) Prior Publication Data

US 2023/0069170 A1   Mar. 2, 2023

(51) Int. Cl.
*H10B 41/27*   (2023.01)
*H01L 29/792*   (2006.01)
*H10B 43/27*   (2023.01)

(52) U.S. Cl.
CPC ......... *H10B 41/27* (2023.02); *H01L 29/7926* (2013.01); *H10B 43/27* (2023.02)

(58) Field of Classification Search
CPC ........ H10B 43/00–50; H10B 41/00–70; H01L 29/7926
See application file for complete search history.

(56) References Cited

U.S. PATENT DOCUMENTS

| | | | |
|---|---|---|---|
| 9,922,987 B1 * | 3/2018 | Mizutani | ................ H10B 43/10 |
| 9,929,174 B1 | 3/2018 | Mizutani et al. | |
| 9,972,640 B1 | 5/2018 | Kai et al. | |
| 10,050,054 B2 | 8/2018 | Zhang et al. | |
| 10,192,878 B1 | 1/2019 | Tsutsumi et al. | |
| 10,236,300 B2 | 3/2019 | Zhang et al. | |
| 10,297,610 B2 | 5/2019 | Kai et al. | |

(Continued)

FOREIGN PATENT DOCUMENTS

| | | |
|---|---|---|
| KR | 10-2021-0059072 A | 5/2021 |
| WO | WO2018-093446 A1 | 5/2018 |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

(Continued)

*Primary Examiner* — Steven M Christopher
*Assistant Examiner* — Tyler J Wiegand
(74) *Attorney, Agent, or Firm* — THE MARBURY LAW GROUP PLLC

(57) ABSTRACT

An alternating stack of insulating layers and sacrificial material layers is formed over a substrate. The sacrificial material layers include a stack of word-line-level sacrificial material layers and at least one drain-select-level sacrificial material layer. Drain-select-level openings are formed through the at least one drain-select-level sacrificial material layer, which is replaced with at least one drain-select-level electrically conductive layer. Memory openings are formed by vertically extending the drain-select-level openings through the word-line-level sacrificial material layers. Memory opening fill structures are formed within the memory openings. The word-line-level sacrificial material layers are replaced with word-line-level electrically conductive layers.

5 Claims, 34 Drawing Sheets

(56) References Cited

U.S. PATENT DOCUMENTS

| | | |
|---|---|---|
| 10,373,969 B2 | 8/2019 | Zhang et al. |
| 10,403,639 B2 | 9/2019 | Orimoto et al. |
| 10,475,804 B1 | 11/2019 | Nishikawa et al. |
| 10,553,599 B1 | 2/2020 | Chen et al. |
| 10,600,800 B2 | 3/2020 | Nishikawa et al. |
| 10,685,978 B1 | 6/2020 | Lu et al. |
| 10,685,979 B1 | 6/2020 | Lu et al. |
| 10,756,110 B1 | 8/2020 | Sharangpani et al. |
| 10,937,800 B2 | 3/2021 | Kim et al. |
| 10,943,917 B2 | 3/2021 | Iwai et al. |
| 2017/0148517 A1 | 5/2017 | Harari |
| 2018/0097009 A1 | 4/2018 | Zhang et al. |
| 2018/0366482 A1* | 12/2018 | Zhou ............... H10B 41/10 |
| 2019/0027488 A1 | 1/2019 | Kai et al. |
| 2019/0027489 A1 | 1/2019 | Orimoto et al. |
| 2019/0035803 A1 | 1/2019 | Zhang et al. |
| 2019/0214395 A1 | 7/2019 | Zhang et al. |
| 2019/0267391 A1 | 8/2019 | Imai et al. |
| 2020/0006358 A1 | 1/2020 | Nishikawa et al. |

OTHER PUBLICATIONS

U.S. Appl. No. 17/031,080, filed Sep. 24, 2020, SanDisk Technologies, LLC.
U.S. Appl. No. 17/126,504, filed Dec. 18, 2020, SanDisk Technologies, LLC.
U.S. Appl. No. 17/375,476, filed Jul. 14, 2021, SanDisk Technologies, LLC.
U.S. Appl. No. 17/385,728, filed Jul. 26, 2021, SanDisk Technologies, LLC.
Notification of Transmittal of International Search Report and Written Opinion of the International Searching Authority for International Patent Application No. PCT/US2022/028223, dated Sep. 7, 2022, 13 pages.

* cited by examiner

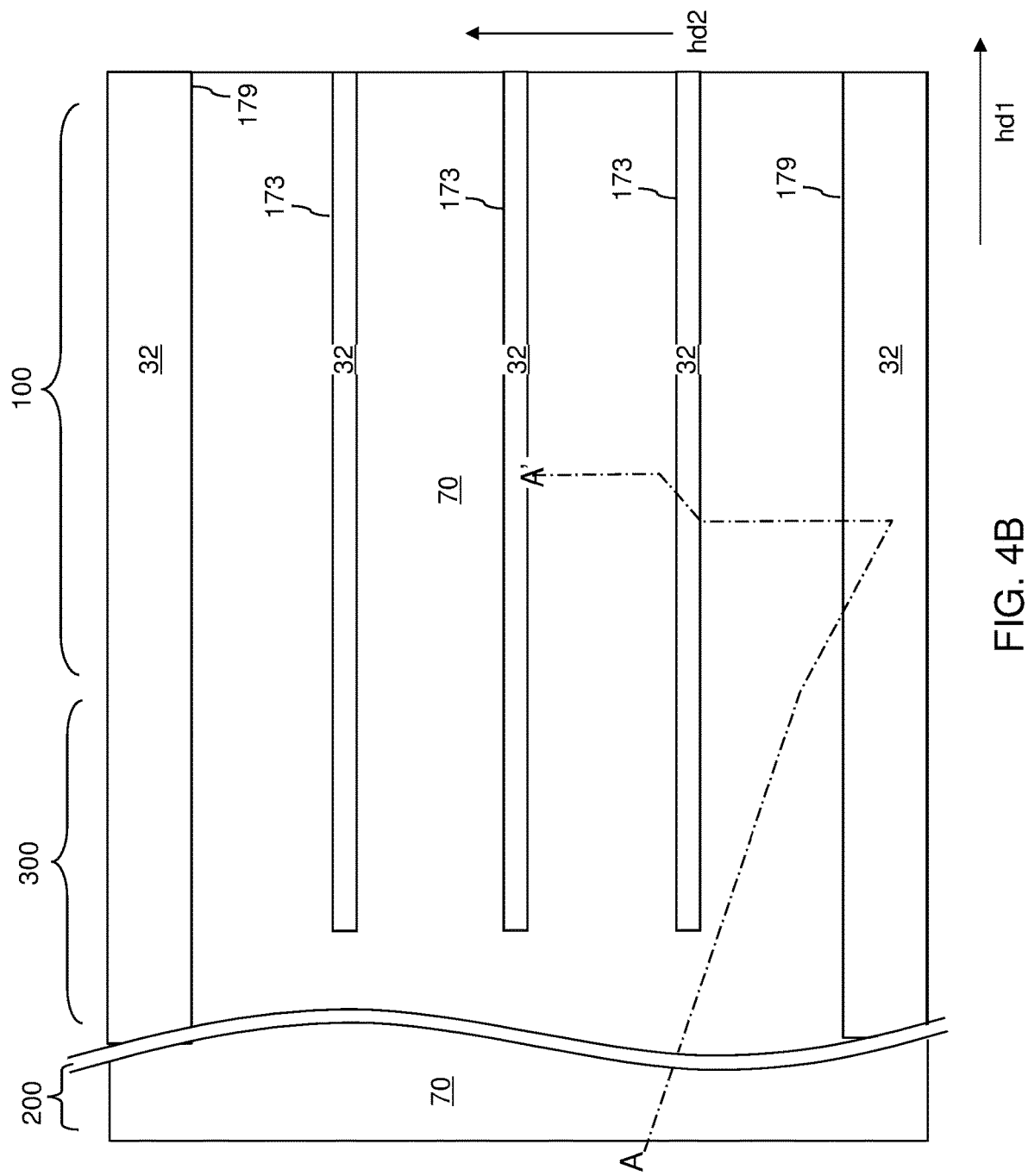

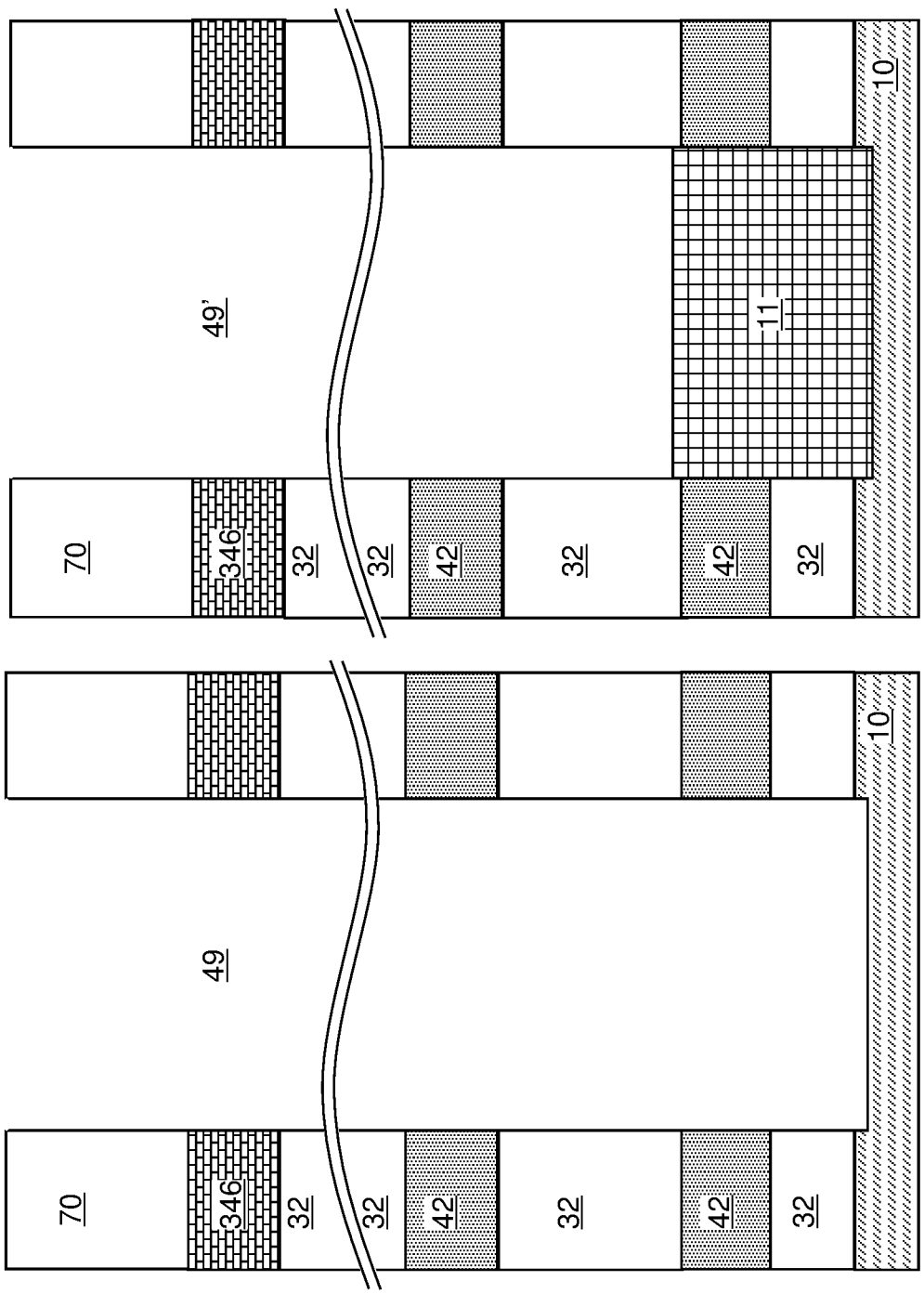

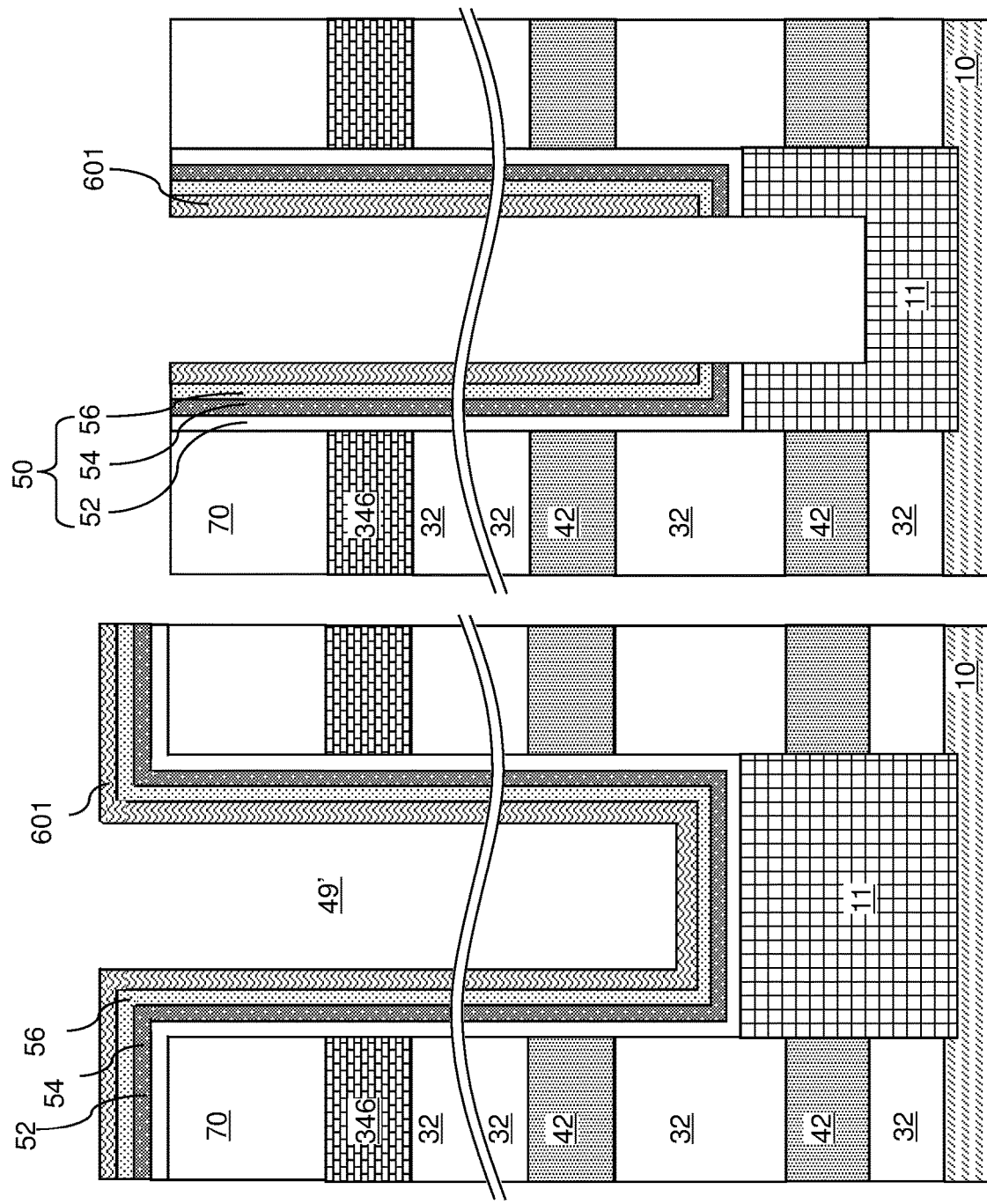

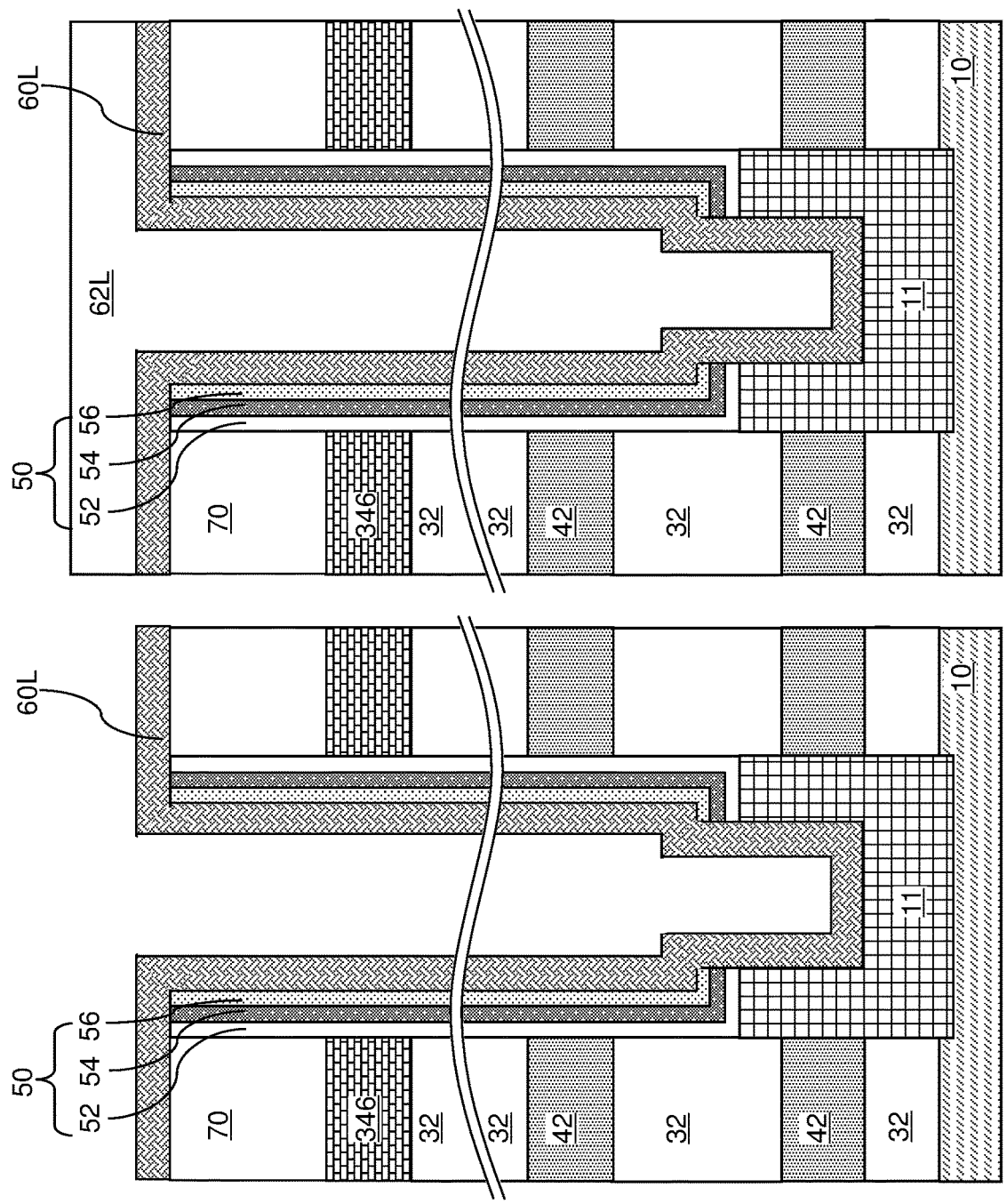

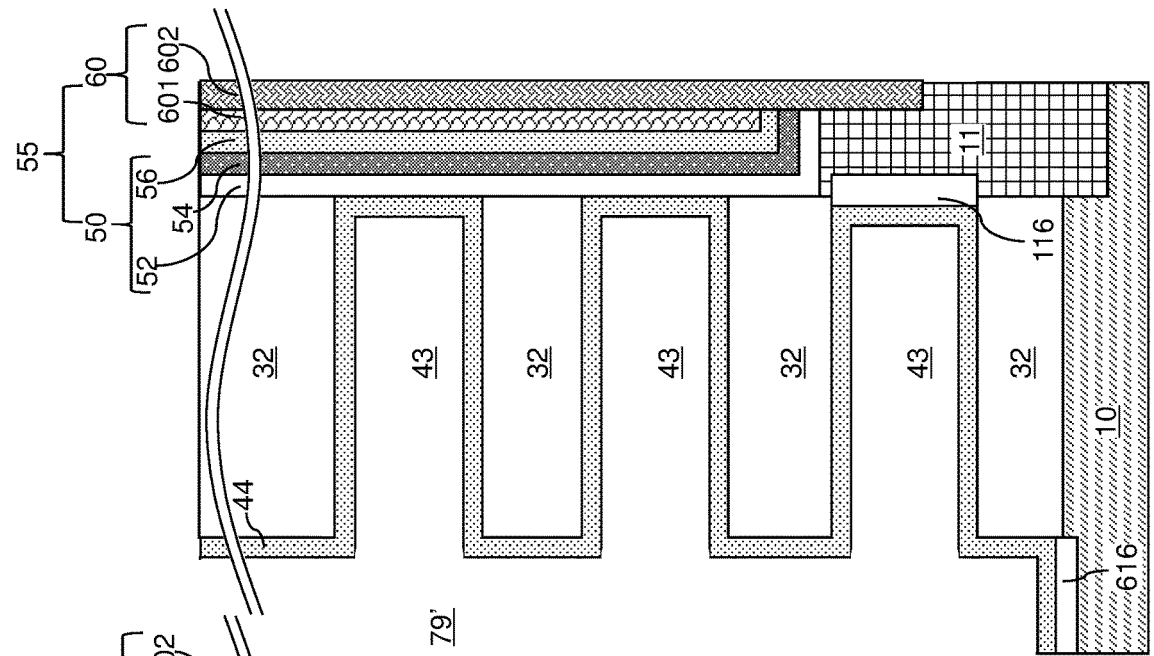
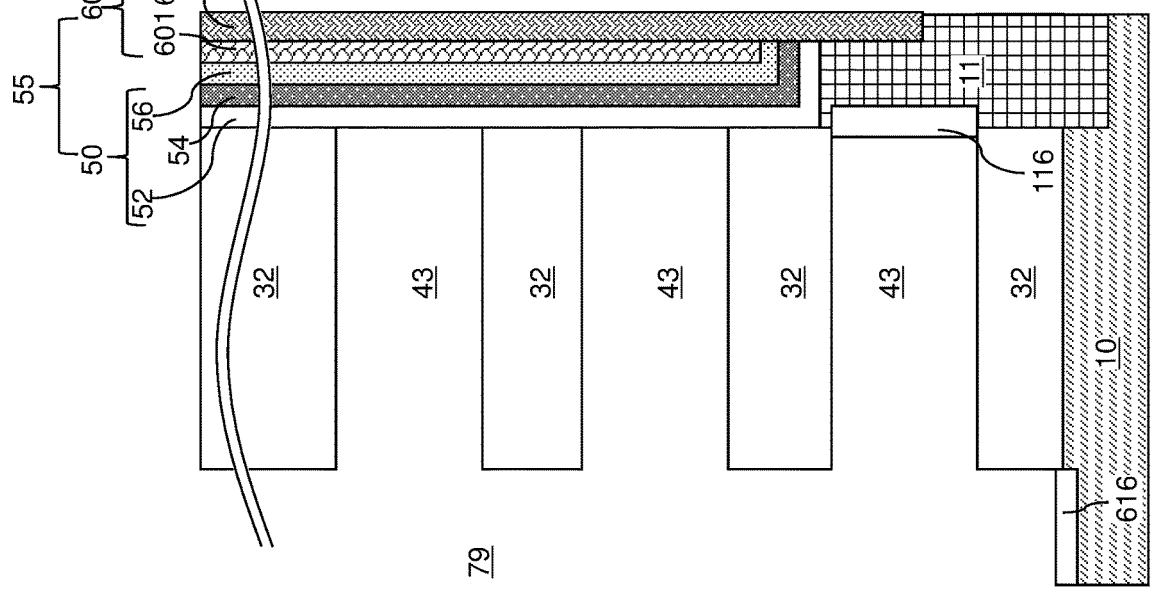
FIG. 16A
FIG. 16B

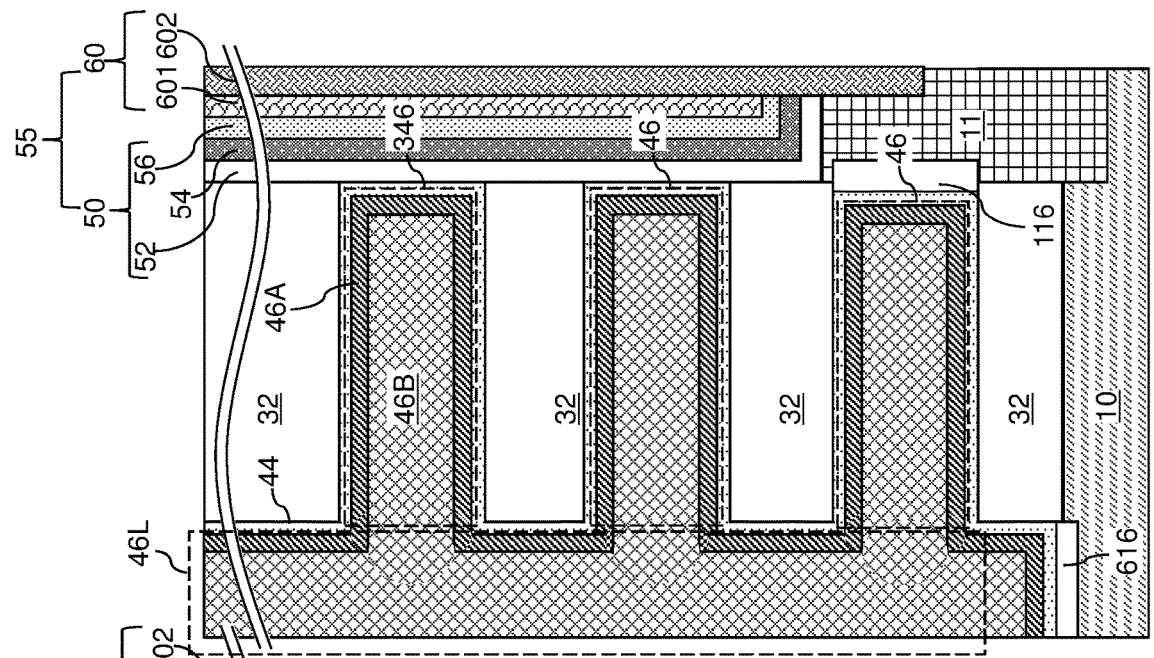
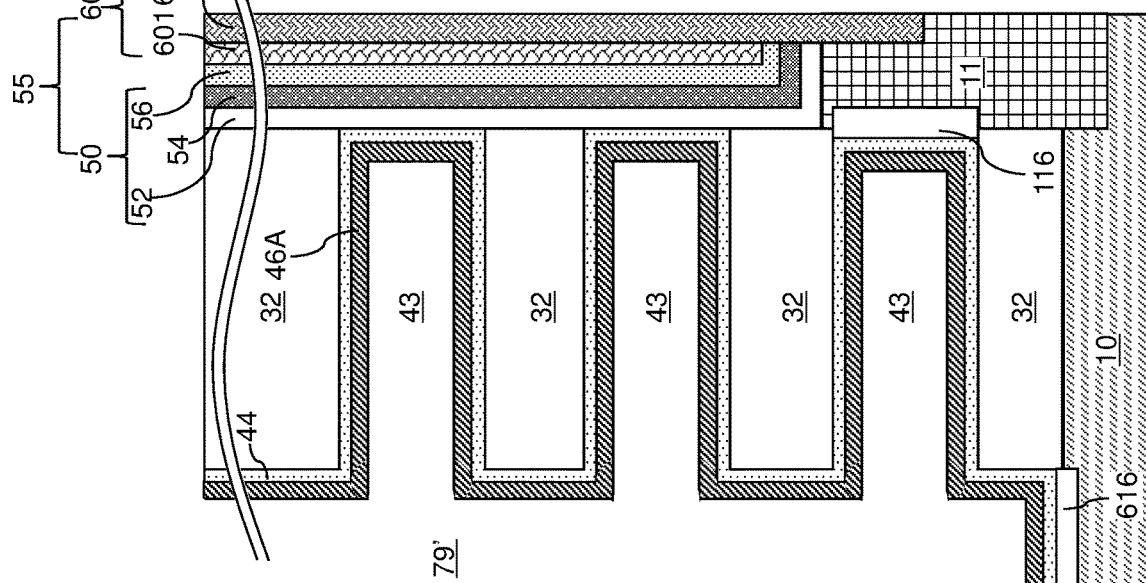

US 11,968,827 B2

THREE-DIMENSIONAL MEMORY DEVICE WITH REPLACEMENT SELECT GATE ELECTRODES AND METHODS OF MANUFACTURING THE SAME

FIELD

The present disclosure relates generally to the field of semiconductor devices, and particularly to a three-dimensional memory device including replacement select gate electrodes and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a three-dimensional memory device is provided, which comprises: forming an alternating stack of insulating layers and sacrificial material layers over a substrate, wherein the sacrificial material layers comprise word-line-level sacrificial material layers and at least one drain-select-level sacrificial material layer that overlies the word-line-level sacrificial material layers; forming drain-select-level openings vertically extending through the at least one drain-select-level sacrificial material layer; replacing the at least one drain-select-level sacrificial material layer with at least one drain-select-level electrically conductive layer; forming memory openings vertically extending through the at least one drain-select-level electrically conductive layer and the word-line-level sacrificial material layers by vertically extending the drain-select-level openings; forming memory opening fill structures within the memory openings, wherein each of the memory opening fill structures comprises a memory film and a vertical semiconductor channel; and replacing the word-line-level sacrificial material layers with word-line-level electrically conductive layers.

According to another aspect of the present disclosure, a three-dimensional memory device is provided, which comprises: an alternating stack of insulating layers and electrically conductive layers, wherein the electrically conductive layers comprise word-line-level electrically conductive layers and a plurality of drain-select-level electrically conductive layers located over the word-line-level electrically conductive layers; memory openings vertically extending through the alternating stack; memory opening fill structures located within a respective one of the memory openings, wherein each of the memory opening fill structures comprises a memory film and a vertical semiconductor channel; a pair of backside trench fill structures vertically extending through each layer within the alternating stack and having a respective pair of lengthwise sidewalls that laterally extend along a first horizontal direction, wherein a width of each of the backside trench fill structures is the same at levels of the drain-select-level electrically conductive layers and at levels of the word-line-level electrically conductive layers; and drain-select-level dielectric spacers in contact with the drain-select-level electrically conductive layers, overlying a horizontal plane including a top surface of a topmost one of the word-line-level electrically conductive layers, and in contact with a sidewall of a respective one of the backside trench fill structures.

BRIEF DESCRIPTION OF THE DRAWINGS

FIG. 4B is a top-down view of the exemplary structure of FIG. 4A. The vertical plane A-A' is the plane of the cross-section for FIG. 4A.

FIGS. 12A-12H are sequential schematic vertical cross-sectional views of a memory opening within the exemplary structure during formation of a memory opening fill structure according to an embodiment of the present disclosure.

FIGS. 16A-16D are sequential vertical cross-sectional views of a region of the exemplary structure during formation of word-line-level electrically conductive layers according to an embodiment of the present disclosure.

DETAILED DESCRIPTION

Figure 1:
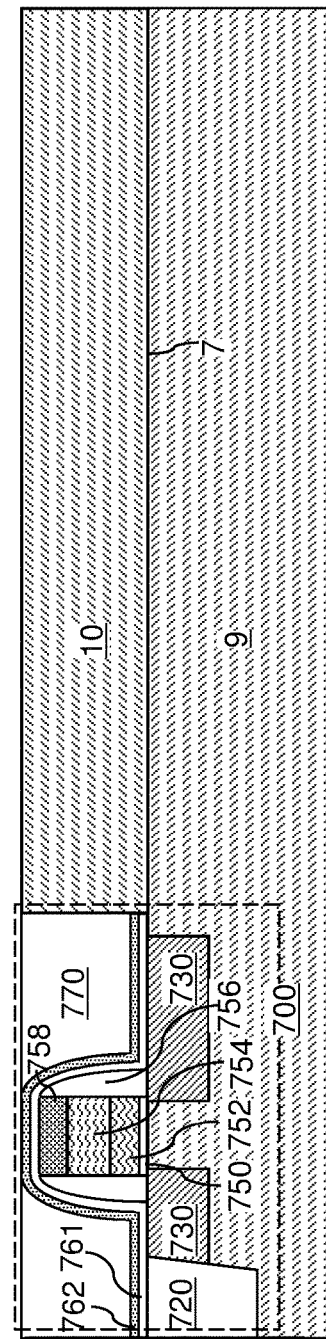
FIG. 1 is a schematic vertical cross-sectional view of an exemplary structure after formation of at least one peripheral device, and a semiconductor material layer according to an embodiment of the present disclosure.

As discussed above, various embodiments of the present disclosure are directed to a three-dimensional memory device including replacement select gate electrodes and methods of manufacturing the same, the various aspects of which are described below. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected for a read operation.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
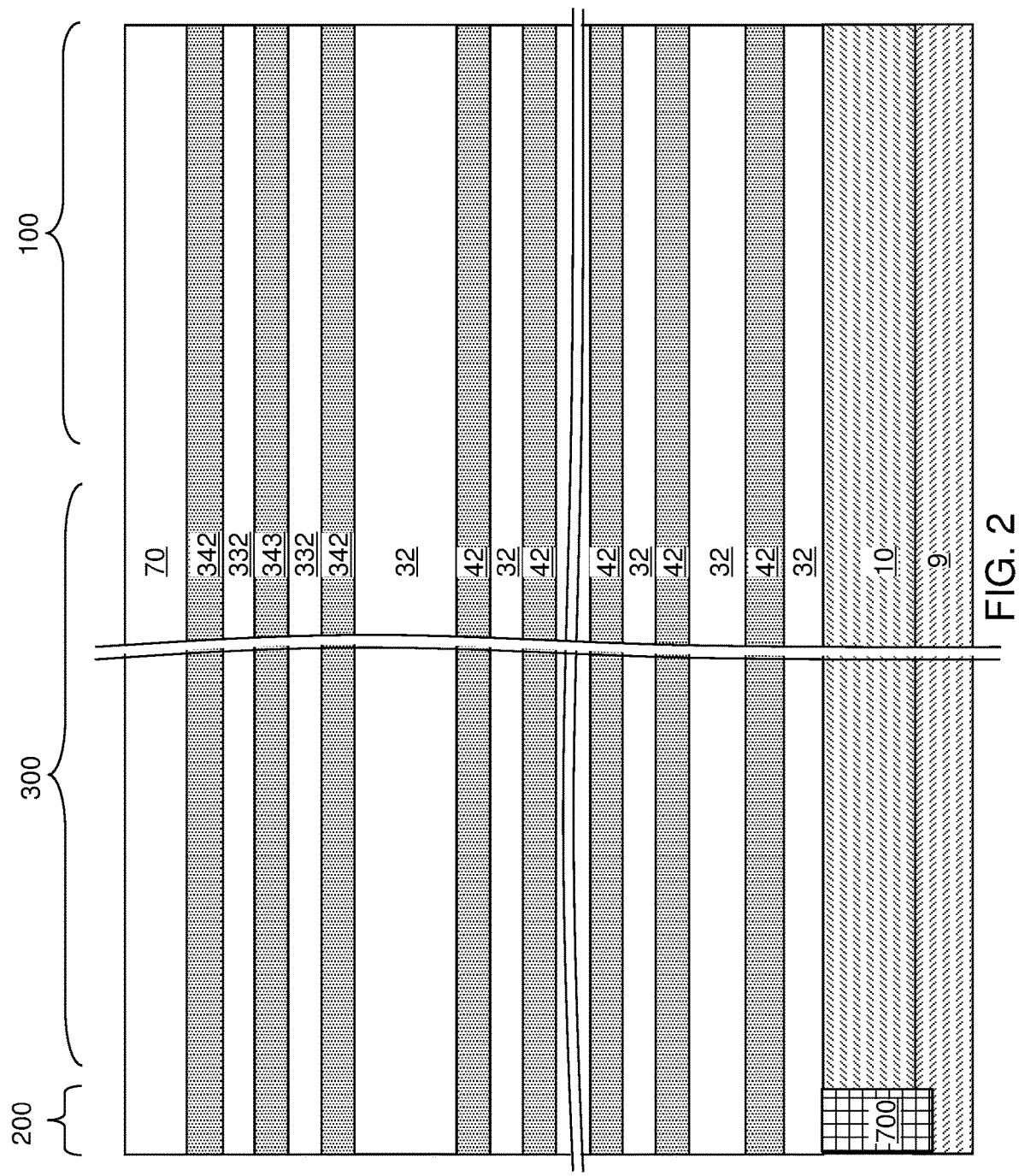
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality, i.e., an alternating stack, of first material layers and second material layers is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each first material layer includes a first material, and each second material layer includes a second material that is different from the first material.

In one embodiment, each first material layer can be an insulating layer 32 or a drain-select-level insulating layer 332, and each second material layer can be a word-line-level sacrificial material layer 42 or a drain-select-level sacrificial material layer 342. Generally, at least one drain-select-level sacrificial material layer 342 can be formed above a plurality of word-line-level sacrificial material layers 42. While the present disclosure is described employing an embodiment in which a plurality of drain-select-level sacrificial material layers 342 is employed, an embodiment is expressly contemplated herein in which a single drain-select-level sacrificial material layer 342 is employed in lieu of the plurality of drain-select-level sacrificial material layers 342. The alternating stack comprises a vertically alternating sequence of the word-line-level insulating layers 32 and the word-line-level sacrificial material layers 42 in a lower portion thereof. The topmost one of the word-line-level insulating layers 32 can have a greater thickness than underlying word-line-level insulating layers 32. For example, the word-line-level insulating layers 32 other than the topmost insulating layer 32 can have a thickness in a range from 20 nm to 60 nm, and the topmost insulating layer 32 can have a thickness in a range from 30 nm to 150 nm, although lesser and greater thicknesses can also be used. The word-line-level sacrificial material layers 42 can have a thickness in a range from 20 nm to 60 nm. A vertically alternating sequence of drain-select-level sacrificial material layers 342 and drain-select-level insulating layers 332 can be formed above the vertically alternating sequence of the word-line-level insulating layers 32 and the word-line-level sacrificial material layers 42. The drain-select-level insulating layers 332 can have a thickness in a range from 20 nm to 60 nm, and the drain-select-level sacrificial material layers 342 can have a thickness in a range from 20 nm to 60 nm. An insulating cap layer 70 can be subsequently formed.

The word-line-level insulating layers 32, the drain-select-level insulating layers 332, and the insulating cap layer 70 are herein collectively referred to as insulating layers (32, 332, 70). The word-line-level sacrificial material layers 42 and the drain-select-level sacrificial material layers 342 are herein collectively referred to as sacrificial material layers (42, 342). The layer stack including the word-line-level insulating layers 32, the word-line-level sacrificial material layers 42, the drain-select-level insulating layers 332, the drain-select-level sacrificial material layers 342, and the insulating cap layer 70 is herein referred to as an alternating stack (32, 42, 332, 342, 70). The word-line-level insulating layers 32, the drain-select-level insulating layers 332, and the insulating cap layer 70 can be composed of the first material, and the word-line-level sacrificial material layers 42 and the drain-select-level sacrificial material layers 342 can be composed of a second material different from that of word-line-level insulating layers 32. Insulating materials that can be used for the word-line-level insulating layers 32, the drain-select-level insulating layers 332, and the insulating cap layer 70 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the word-line-level insulating layers 32, the drain-select-level insulating layers 332, and the insulating cap layer 70 can be silicon oxide.

The second material of the word-line-level sacrificial material layers 42 and the drain-select-level sacrificial material layers 342 is a sacrificial material that can be removed selective to the first material of the word-line-level insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The word-line-level sacrificial material layers 42 and the drain-select-level sacrificial material layers 342 may comprise an insulating material, a semiconductor material, or a conductive material. The second material of the word-line-level sacrificial material layers 42 and the drain-select-level sacrificial material layers 342 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the word-line-level sacrificial material layers 42 and the drain-select-level sacrificial material layers 342 can be spacer material layers that comprise silicon nitride or a semiconductor material including at least one of silicon and germanium.

In one embodiment, the word-line-level insulating layers 32, the drain-select-level insulating layers 332, and the insulating cap layer 70 can include silicon oxide, and sacrificial material layers can include silicon nitride sacrificial material layers. The first material of the word-line-level insulating layers 32, the drain-select-level insulating layers 332, and the insulating cap layer 70 can be deposited, for example, by chemical vapor deposition (CVD). For example, if silicon oxide is used for the word-line-level insulating layers 32, the drain-select-level insulating layers 332, and the insulating cap layer 70, tetraethyl orthosilicate (TEOS) can be used as the precursor material for the CVD process. The second material of the word-line-level sacrificial material layers 42 and the drain-select-level sacrificial material layers 342 can be formed, for example, CVD or atomic layer deposition (ALD).

While the descriptions of the present disclosure refer to an embodiment in which the word-line-level sacrificial material layers 42 and the drain-select-level sacrificial material layers 342 are formed as space material layers that are formed between each vertically neighboring pair of the word-line-level insulating layers 32, the drain-select-level insulating layers 332, and the insulating cap layer 70, in other embodiments electrically conductive layers are formed as spacer material layers in lieu of the word-line-level sacrificial material layers 42 and the drain-select-level sacrificial material layers 342. In this case, steps for replacing the spacer material layers with electrically conductive layers can be omitted.

Figure 3:
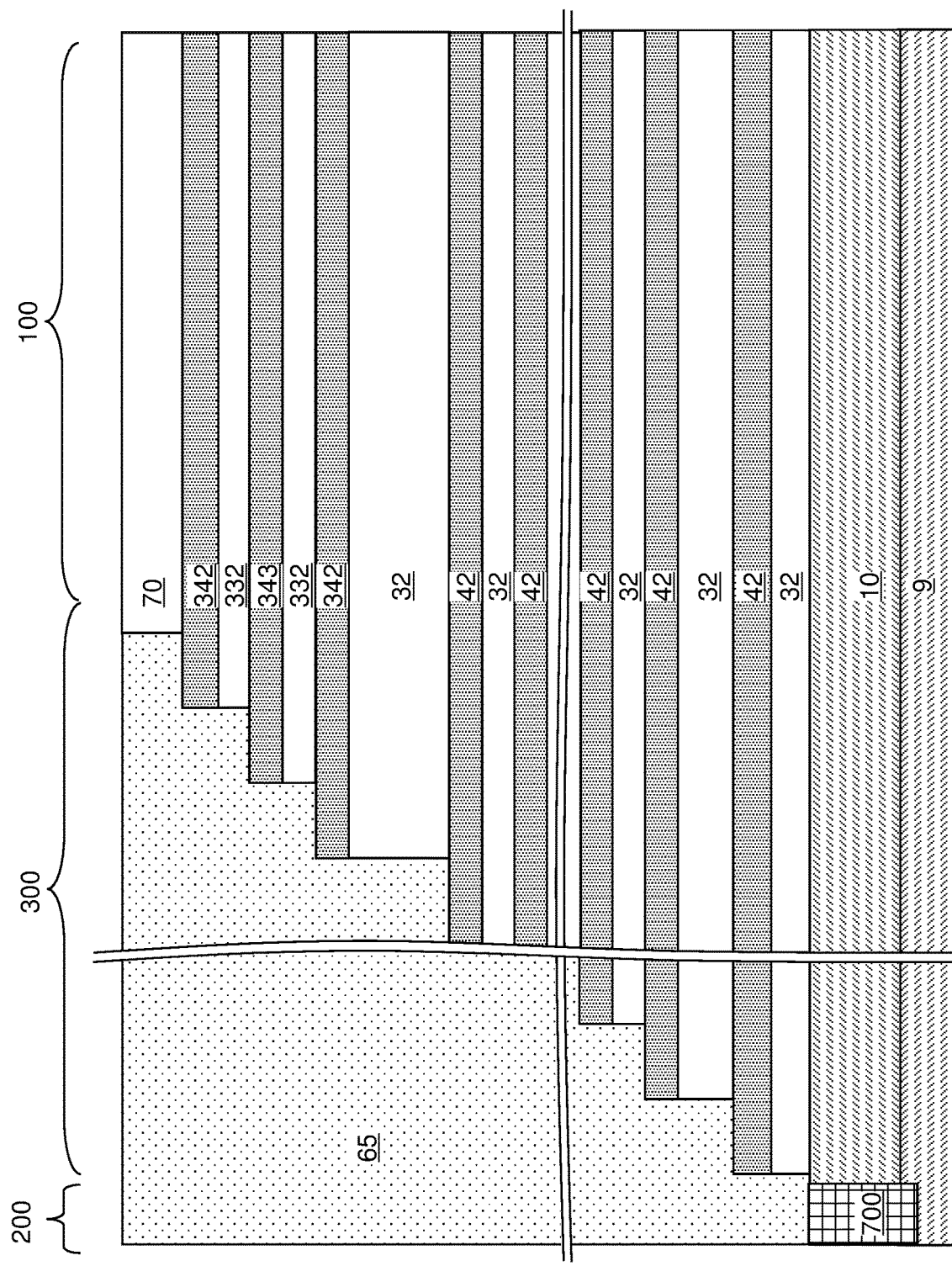
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42, 332, 342, 70), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42, 332, 342, 70) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each word-line-level sacrificial material layer 42 other than a topmost word-line-level sacrificial material layer 42 within the alternating stack (32, 42, 332, 342, 70) laterally extends farther than any overlying word-line-level sacrificial material layer 42 within the alternating stack (32, 42, 332, 342, 70) in the terrace region. The terrace region includes stepped surfaces of the alternating stack (32, 42, 332, 342, 70) that continuously extend from a bottommost layer within the alternating stack (32, 42, 332, 342, 70) to a topmost layer within the alternating stack (32, 42, 332, 342, 70).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Figure 4A:
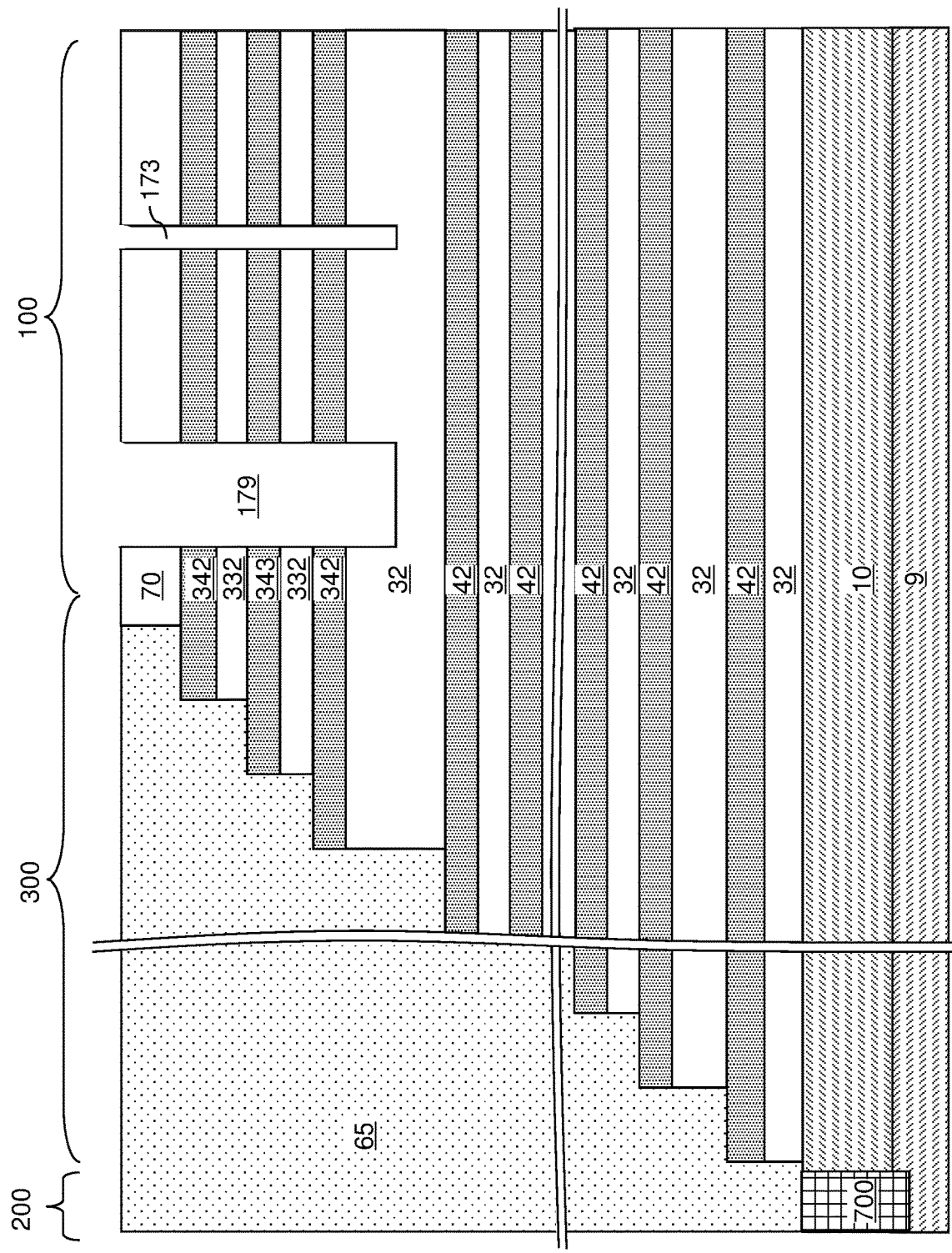
FIG. 4A is a schematic vertical cross-sectional view of the exemplary structure after formation of drain-select-level isolation trenches and drain-select-level backside trenches according to an embodiment of the present disclosure.

Referring to FIGS. 4A and 4B, a photoresist layer (not shown) can be applied over the insulating cap layer 70, and can be lithographically patterned to form line-shaped openings that laterally extend along a first horizontal direction (e.g., word line direction) hd1 and laterally spaced apart along a second horizontal direction (e.g., bit line direction) hd2 that is perpendicular to the first horizontal direction hd2. The line-shaped openings comprise first-type line-shaped openings that are formed in areas in which backside trenches are to be subsequently formed, and second-type line-shaped openings that are formed between a neighboring pair of first-type line-shaped openings. One or more second-type line-shaped openings can be formed between each neighboring pair of first-type line-shaped openings.

An anisotropic etch process can be performed to transfer the pattern of the openings in the photoresist layer though the insulating cap layer 70, the drain-select-level insulating layers 332, and the drain-select-level sacrificial material layers 342. Trenches (179, 173) are formed in volumes from which the materials of the insulating cap layer 70, the drain-select-level insulating layers 332, and the drain-select-level sacrificial material layers 342 are removed underneath the openings in the photoresist layer. The trenches (179, 173) comprise drain-select-level backside trenches 179 that replicate the pattern of the first-type line-shaped openings in the photoresist layer, and drain-select-level isolation trenches 173 that replicate the pattern of the second-type line-shaped openings in the photoresist layer. The bottom surfaces of the drain-select-level backside trenches 179 and the drain-select-level isolation trenches 173 can be located within a topmost one of the word-line-level insulating layers 32.

In one embodiment, each of the drain-select-level backside trenches 179 may have a rectangular horizontal cross-sectional shape, and may have a respective pair of straight lengthwise sidewalls that laterally extend along the first horizontal direction hd1. The width of each drain-select-level backside trenches 179 along the second horizontal direction hd2 may be in a range from 50 nm to 1,000 nm, such as from 100 nm to 500 nm, although lesser and greater widths may also be employed. Each of the drain-select-level isolation trenches 173 may have a respective pair of straight lengthwise sidewalls that laterally extend along the first horizontal direction hd1, or may have a pair of wiggled lengthwise sidewalls that laterally extend generally along the first horizontal direction hd1 with lateral undulations along the second horizontal direction hd2 with a periodicity that is the same as the periodicity of rows of memory openings to be subsequently formed. The lateral spacing between a pair of lengthwise sidewalls of each drain-select-level isolation trench 173 may be in a range from 10 nm to 100 nm, such as from 20 nm to 50 nm, although lesser and greater lateral spacings may also be employed. The drain-select-level isolation trenches 173 may be narrower than the drain-select-level backside trenches 179. Generally, each of the drain-select-level isolation trenches 173 and the drain-select-level backside trenches 179 can have a respective bottom surface above the horizontal plane including the top surface of a topmost one of the word-line-level sacrificial material layers 42.

Figure 5A:
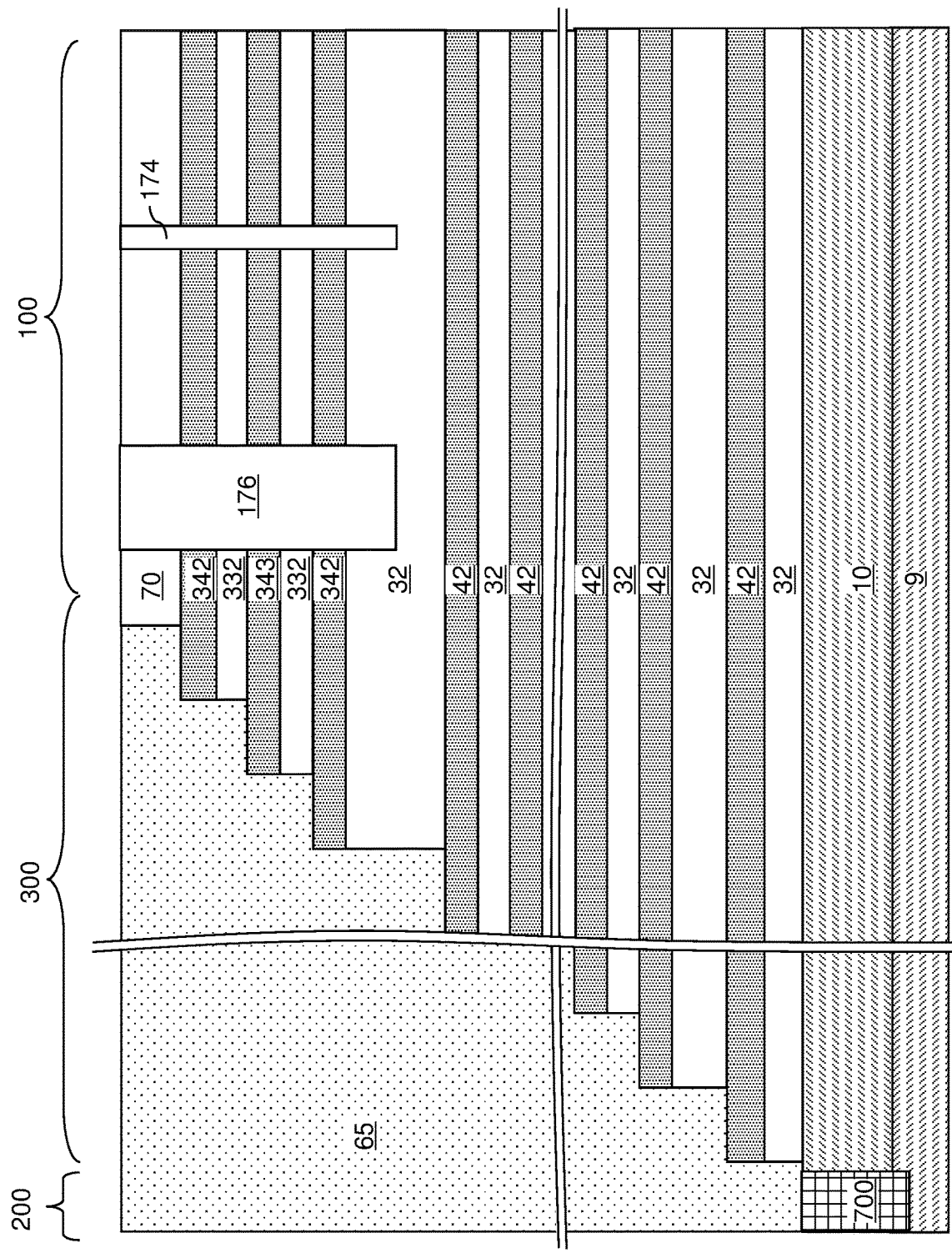
FIG. 5A is a schematic vertical cross-sectional view of the exemplary structure after formation of drain-select-level isolation structures and drain-select-level dielectric rails according to an embodiment of the present disclosure.
Figure 5B:
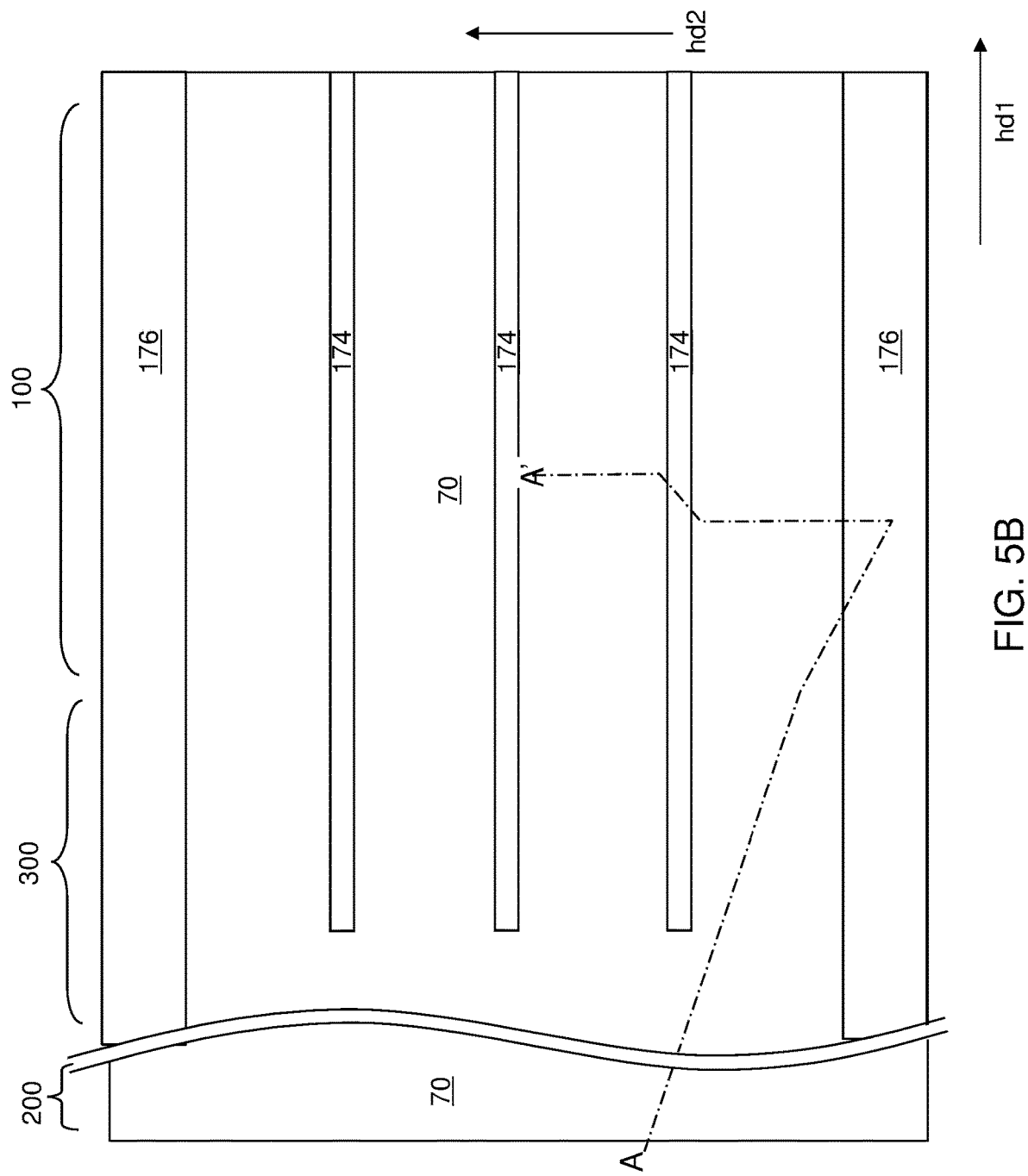
FIG. 5B is a top-down view of the exemplary structure of FIG. 5A. The vertical plane A-A' is the plane of the cross-section for FIG. 5A.

Referring to FIGS. 5A and 5B, a dielectric fill material, such as undoped silicate glass, can be deposited in the drain-select-level isolation trenches 173 and the drain-select-level backside trenches 179. Excess portions of the dielectric fill material can be removed from above the horizontal plane including the top surface of the insulating cap layer 70 and the retro-stepped dielectric material portion 65 by performing a chemical mechanical polishing process or a recess etch process. The recess etch process may comprise a wet etch process or a reactive ion etch process. Each remaining portion of the dielectric fill material filling a respective drain-select-level backside trench 179 comprises a drain-select-level dielectric rail 176. Each remaining portion of the dielectric fill material filling a respective drain-select-level isolation trench 173 comprises drain-select-level isolation structure 174.

In one embodiment, each of the drain-select-level isolation structures 174 and the drain-select-level dielectric rails 176 can have a respective bottom surface above a horizontal plane including the top surface of a topmost one of the word-line-level sacrificial material layers 42. In one embodiment, each of the drain-select-level isolation structures 174 can vertically extend through a plurality of drain-select-level sacrificial material layers 342, can be located between a respective pair of and the drain-select-level dielectric rails 176, and can have a bottom surface located above the horizontal plane including the top surface of the topmost one of the word-line-level sacrificial material layers 42. In one embodiment, the drain-select-level isolation structures 174 and the drain-select-level dielectric rails 176 can have a same dielectric material composition throughout. In one embodiment, the drain-select-level isolation structures 174 may be narrower than the drain-select-level dielectric rails 176.

Figure 6A:
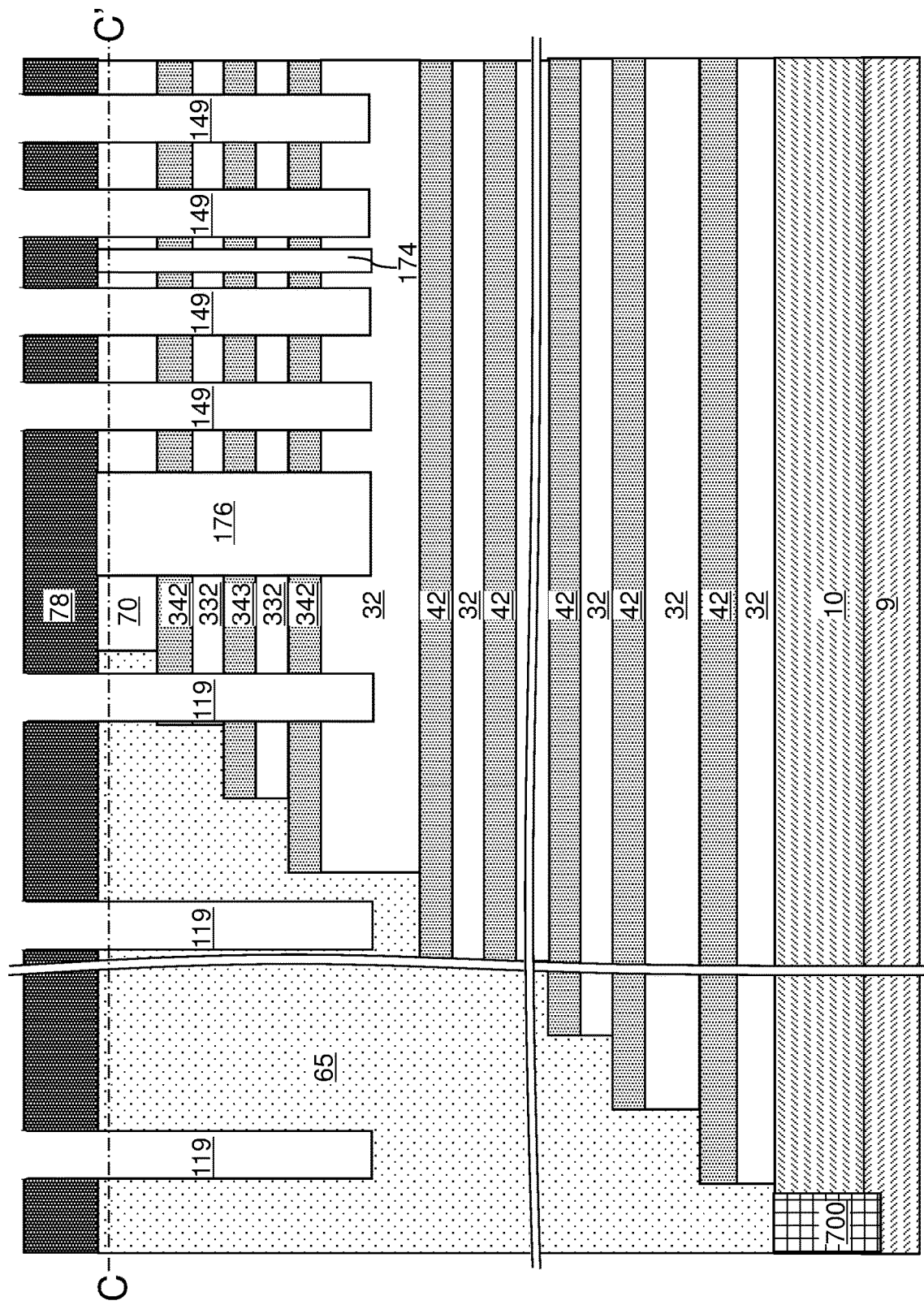
FIG. 6A is a schematic vertical cross-sectional view of the exemplary structure after formation of a patterned hard mask layer and drain-select-level openings according to an embodiment of the present disclosure.
Figure 6B:
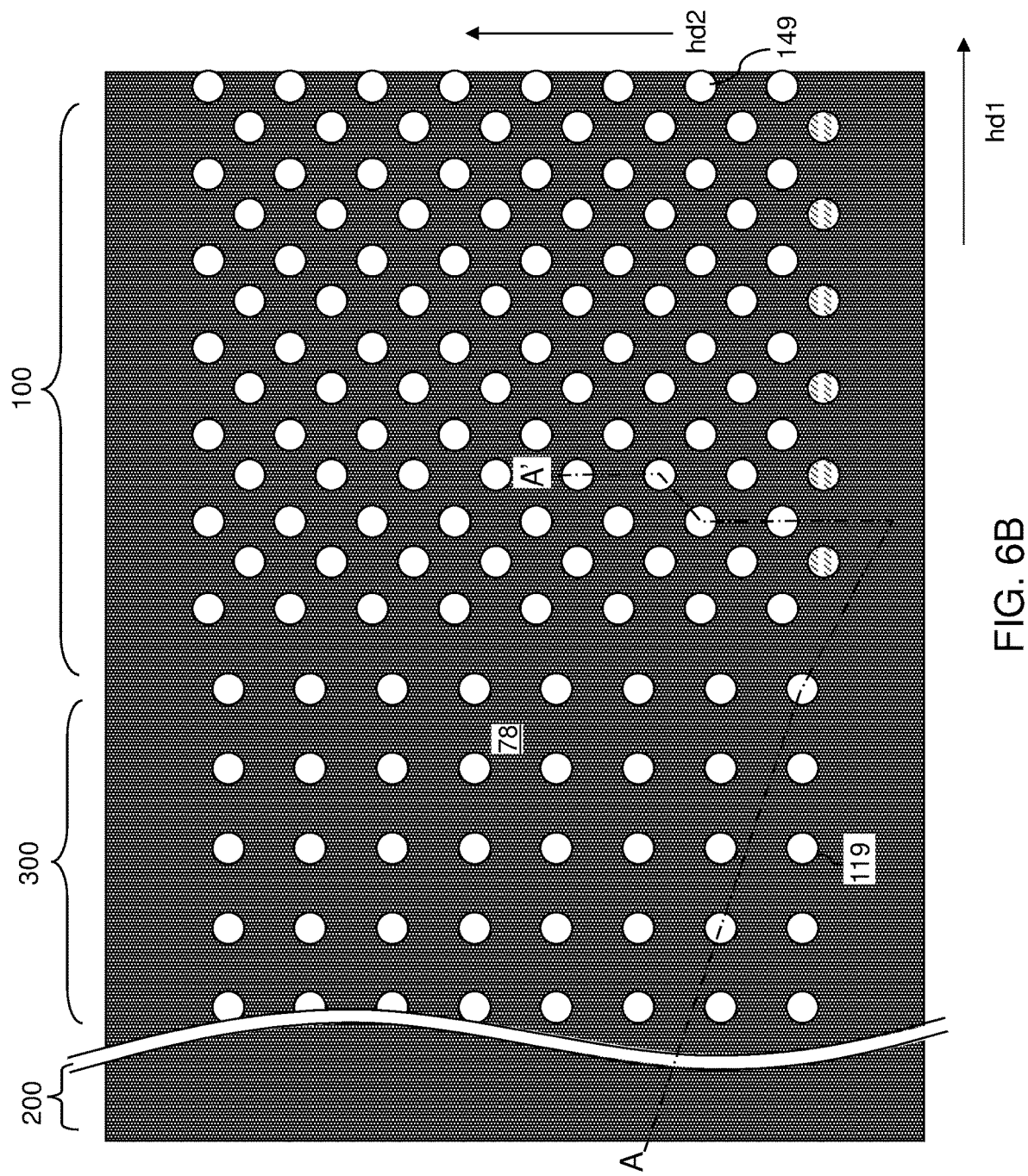
FIG. 6B is a top-down view of the exemplary structure of FIG. 6A. The vertical plane A-A' is the plane of the cross-section for FIG. 6A.
Figure 6C:
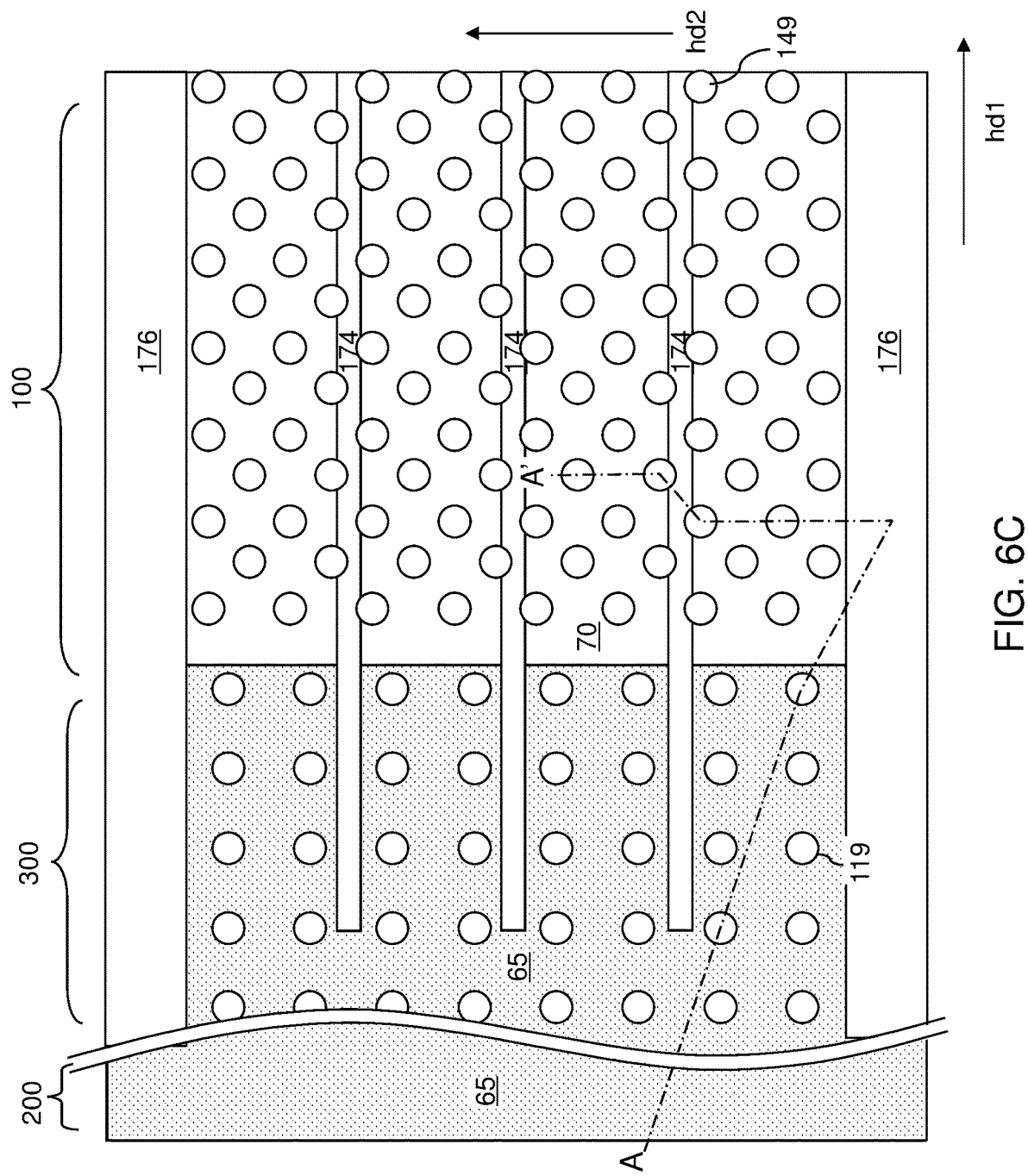
FIG. 6C is a horizontal cross-sectional view of the exemplary structure along the horizontal plane C-C' of FIG. 6A.

Referring to FIGS. 6A-6C, a patterned hard mask layer 78 can be formed over the alternating stack (32, 42, 332, 342, 70) and the retro-stepped dielectric material portion 65. The patterned hard mask layer 78 can be formed by depositing a blanket hard mask material layer by applying and patterning a photoresist layer over the blanket hard mask material layer, and by transferring the pattern in the photoresist layer though the blanket hard mask material layer by performing an anisotropic etch process. The photoresist layer may, or may not, be removed after formation of the patterned hard mask layer 78. The patterned hard mask layer 78 may comprise a carbon-based patterning film, such as an amorphous carbon layer, a boron doped carbon layer or a silicon carbide layer.

A first anisotropic etch process can be performed, which can employ the patterned hard mask layer 78 (and any remaining portion of the patterned photoresist layer, if present) as an etch mask. The pattern of openings in the patterned hard mask layer 78 is transferred through the at least one drain-select-level sacrificial material layer 342. In one embodiment, the first anisotropic etch process can transfer the pattern of the openings in the patterned hard mask layer 78 through the insulating cap layer 70, the drain-select-level sacrificial material layers 342, and the drain-select-level insulating layers 332, and into an upper portion of a topmost one of the word-line-level insulating layers 32.

Drain-select-level openings (149, 119) that replicate the pattern of the openings in the patterned hard mask layer 78 can be formed through the insulating cap layer 70, the drain-select-level sacrificial material layers 342, and the drain-select-level insulating layers 332. In one embodiment, each of the drain-select-level openings (149, 119) may have a respective bottom surface located above the horizontal plane including the top surface of the topmost one of the word-line-level sacrificial material layers 42.

The drain-select-level openings (149, 119) comprise drain-select-level memory openings 149 and drain-select-level support openings 119. As used herein, a "memory opening" refers to a cavity in which memory elements, such as a memory stack structure, is subsequently formed. As used herein, a "support opening" refers to a cavity in which a support structure (such as a support pillar structure) that mechanically supports other elements is subsequently formed. As used herein, a "drain-select-level memory opening" refers to a portion of a memory opening that is formed at drain select levels. As used herein, a "drain-select-level support opening" refers to a portion of a support opening that is formed at the drain select levels. The drain-select-level memory openings 149 are formed through each layer of the insulating cap layer 70, the drain-select-level sacrificial material layers 342, and the drain-select-level insulating layers 332 in the memory array region 100. The drain-select-level support openings 119 are formed through the retro-stepped dielectric material portion 65 and the portions of the insulating cap layer 70, the drain-select-level sacrificial material layers 342, and the drain-select-level insulating layers 332 located in the staircase region 300. A subset of the drain-select-level support openings 119 can be formed in areas outside of the areas of the insulating cap layer 70, the drain-select-level sacrificial material layers 342, and the drain-select-level insulating layers 332.

In one embodiment, the drain-select-level memory openings 149 may comprise sets of multiple rows of drain-select-level memory openings 149. In one embodiment, each set of multiple rows of drain-select-level memory openings 149 can be formed between a respective neighboring pair among the drain-select-level isolation structures 174 and the drain-select-level dielectric rails 176.

Figure 7:
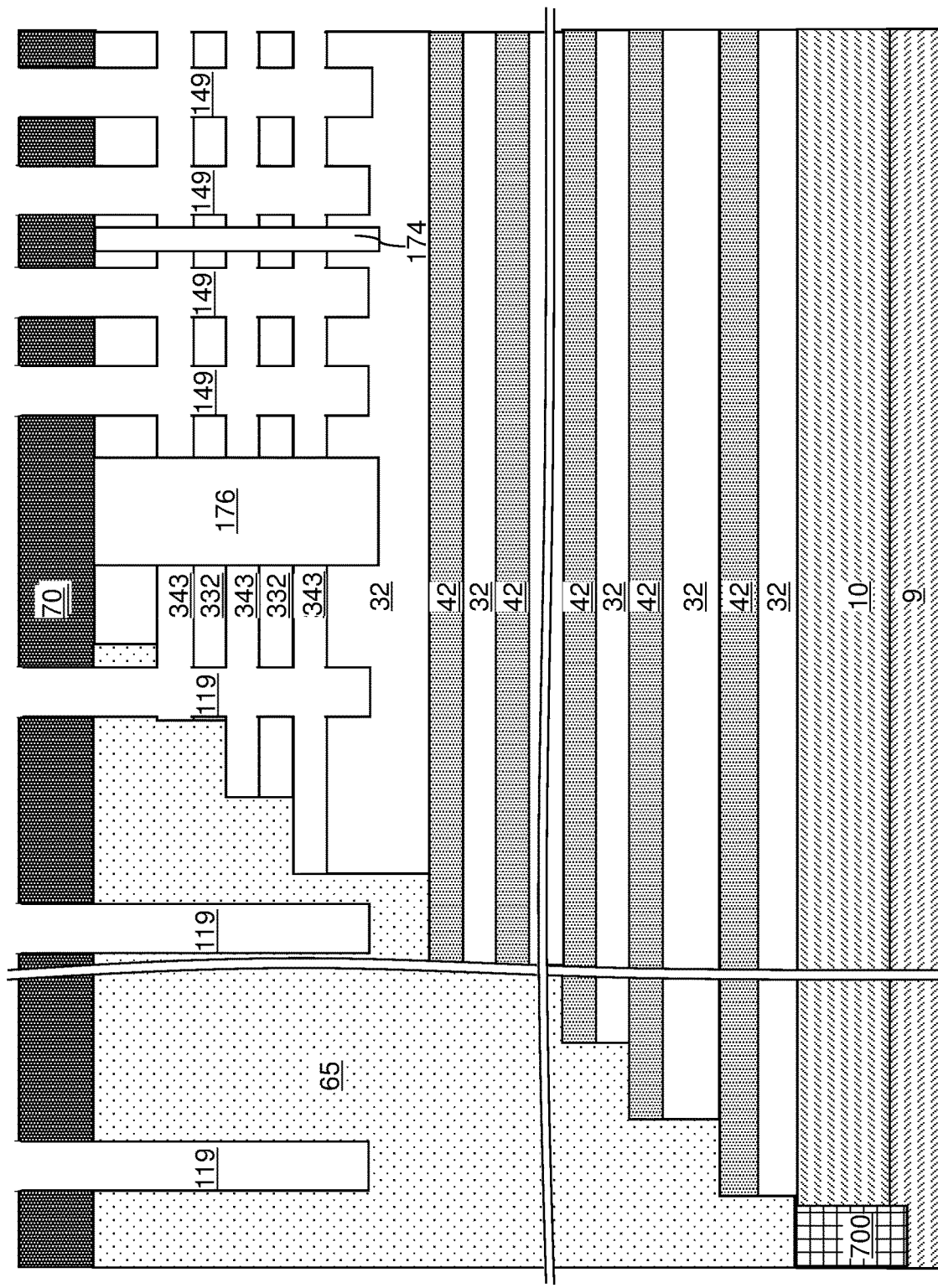
FIG. 7 is a schematic vertical cross-sectional view of the exemplary structure after formation of drain-select-level cavities according to an embodiment of the present disclosure.

Referring to FIG. 7, a first selective isotropic etch process can be performed to remove the at least one drain-select-level sacrificial material layer 342, which may comprise a plurality of drain-select-level sacrificial material layers 342. The first selective isotropic etch process supplies an isotropic etchant into the drain-select-level openings (149, 119). The isotropic etchant has an etch chemistry that etches the material of the at least one drain-select-level sacrificial material layer 342 selective to the materials of the insulating layers (32, 332, 70), the drain-select-level dielectric rails 176, the drain-select-level isolation structures 174, and the retro-stepped dielectric material portion 65. For example, the at least one drain-select-level sacrificial material layer 342 may comprise silicon nitride, the insulating layers (32, 332, 70), the drain-select-level dielectric rails 176, the drain-select-level isolation structures 174, and the retro-stepped dielectric material portion 65 may comprise silicon oxide materials, and the isotropic etchant of the first selective isotropic etch process may comprise hot phosphoric acid, i.e., phosphoric acid at a boiling temperature. Drain-select-level cavities 343 are formed in volumes from which the at least one drain-select-level sacrificial material layer 342 is removed by the first selective isotropic etch process.

Figure 8:
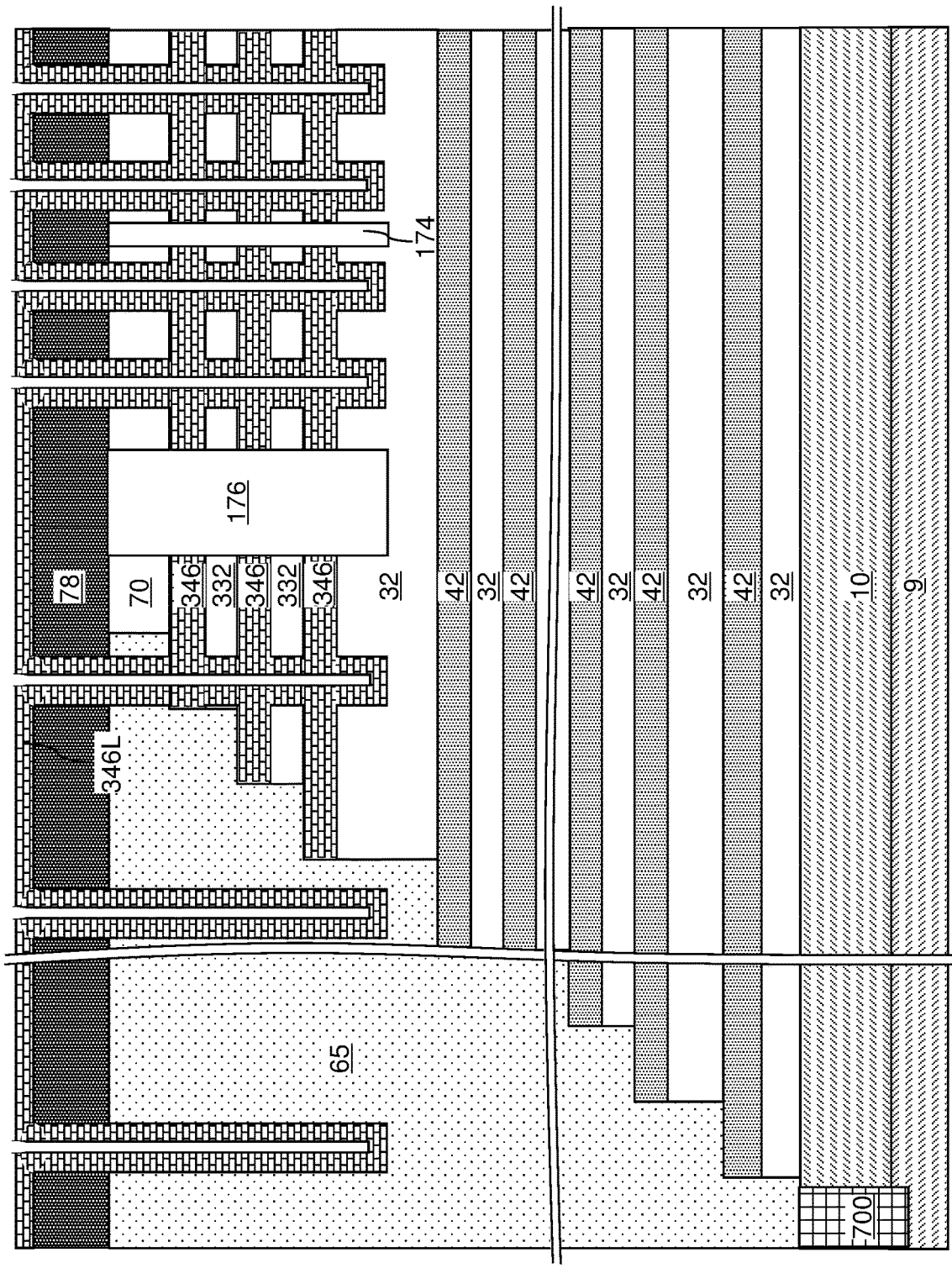
FIG. 8 is a schematic vertical cross-sectional view of the exemplary structure after conformally depositing at least one conductive material in the drain-select-level cavities according to an embodiment of the present disclosure.

Referring to FIG. 8, at least one conductive material can be conformally deposited in the drain-select-level cavities 343. A conformal deposition process that supplies a reactant into the drain-select-level openings (149, 119) can be performed to deposit the at least one conductive material in the drain-select-level cavities 343. The conformal deposition process may comprise a chemical vapor deposition process and/or an atomic layer deposition process. In one embodiment, the at least one conductive material can include a conductive liner (not expressly shown) and a conductive fill material layer. The conductive liner can include a conductive metallic liner such as TiN, TaN, WN, MoN, TiC, TaC, WC, an alloy thereof, or a stack thereof. The thickness of the conductive liner can be in a range from 1 nm to 6 nm, although lesser and greater thicknesses can also be used. For example, TiN exhibits sufficient adhesion to carbon based materials in case the hard mask layer 78 comprises a carbon based material. The conductive fill material layer can include a metal or a metallic alloy. For example, the conductive fill material layer can include W, Cu, Al, Co, Mo, Ru, Ni, an alloy thereof, or a stack thereof. The thickness of the at least one conductive material can be selected such that the drain-select-level cavities 343 are filled within the at least one conductive material, and a vertically-extending cavity that is not filled with the at least one conductive material is present in the middle of each of the drain-select-level openings (149, 119). The at least one conductive material forms a continuous drain-select-level conductive layer 346L, which fills each of the drain-select-level cavities 343 and peripheral portions of the drain-select-level openings (149, 119) and extends over the top surface of the patterned hard mask layer 78.

Figure 9:
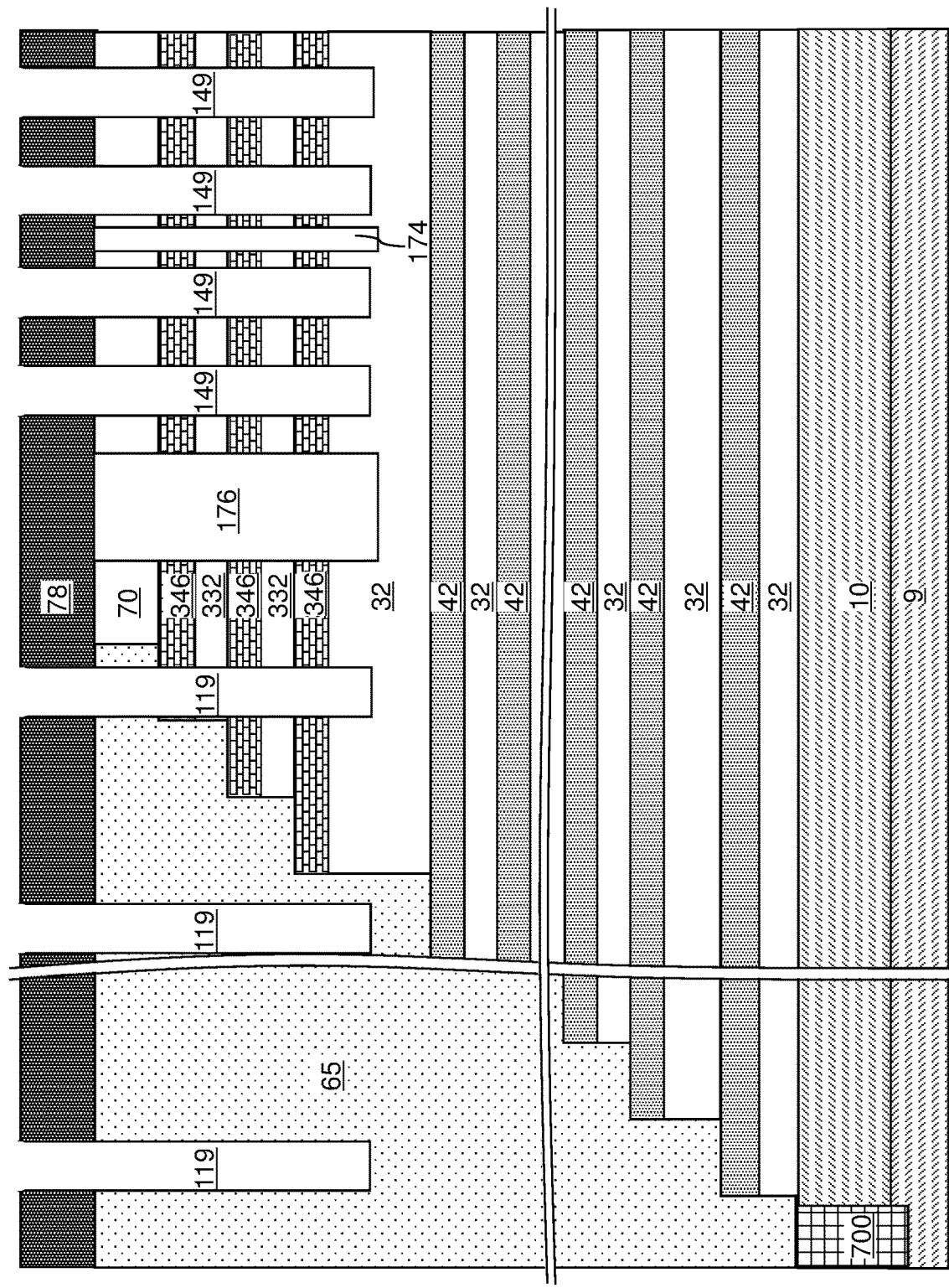
FIG. 9 is a schematic vertical cross-sectional view of the exemplary structure after removing the at least one conductive material from the drain-select-level openings according to an embodiment of the present disclosure.

Referring to FIG. 9, the at least one conductive material can be removed from inside the drain-select-level openings (149, 119) and from above the alternating stack (32, 42, 332, 342, 70) by performing an anisotropic etch process that etches the at least one conductive material selective to the material of the insulating layers (32, 332, 70) and/or the hard mask layer 78. Remaining portions of the at least one conductive material filling the at least one drain-select-level cavity 343 comprise at least one drain-select-level electrically conductive layer 346, which may comprise a plurality of drain-select-level electrically conductive layers 346 that are vertically spaced apart and interlaced with the drain-select-level insulating layers 332. Generally, the at least one drain-select-level sacrificial material layer 342 can be replaced with the at least one drain-select-level electrically conductive layer 346 while the patterned hard mask layer 78 is present over the alternating stack (32, 42, 332, 342, 70). In one embodiment, a plurality of drain-select-level sacrificial material layer 342 can be replaced with a plurality of drain-select-level electrically conductive layers 346 while the patterned hard mask layer 78 is present over the alternating stack (32, 42, 332, 342, 70). In one embodiment, each of the plurality of drain-select-level electrically conductive layers 346 can contact horizontal surfaces of a pair of insulating layers among the insulating layers (32, 332, 70). The drain-select-level electrically conductive layers 346 function as drain side select gate electrodes of vertical NAND strings.

Figure 10A:
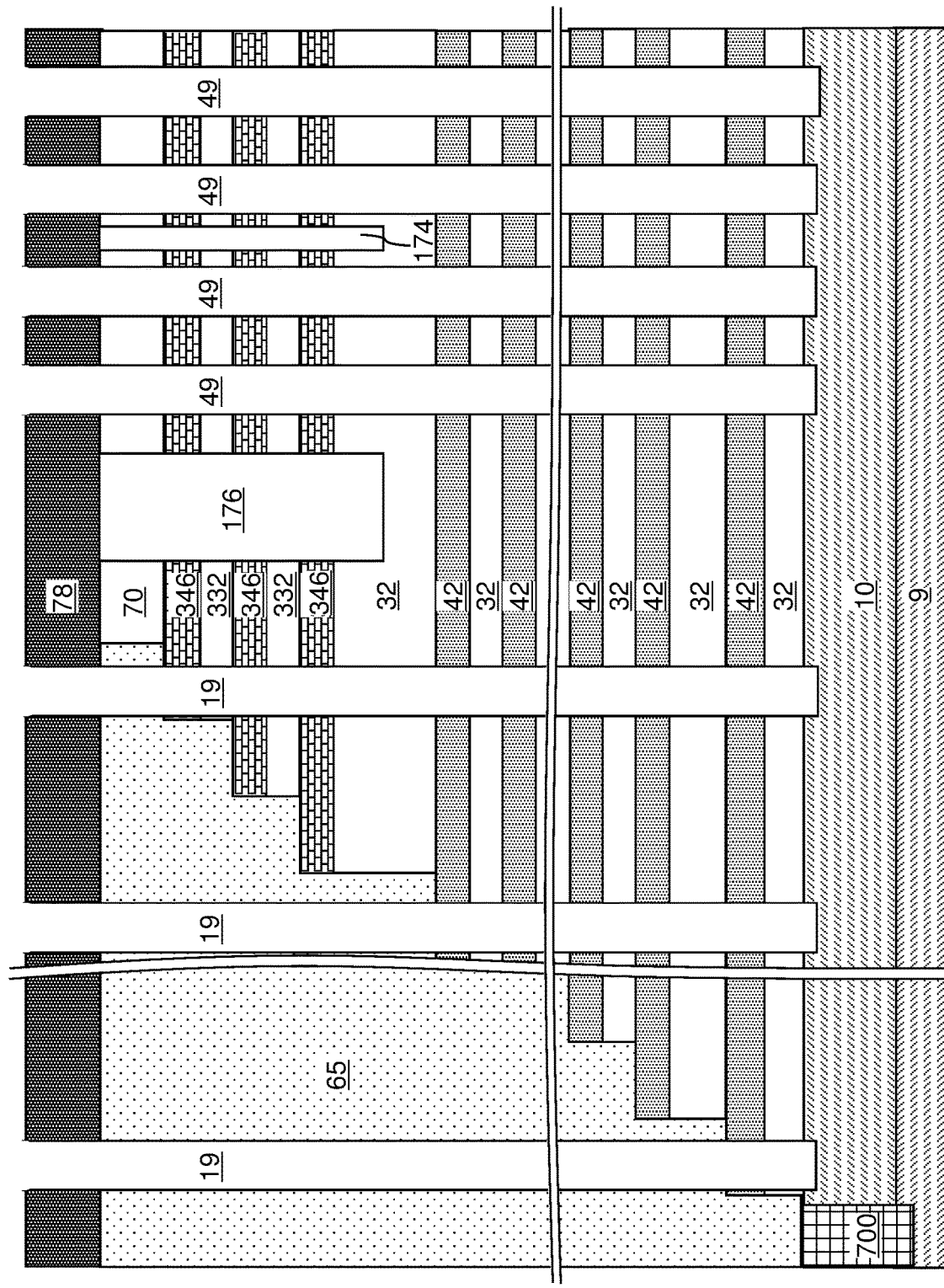
FIG. 10A is a schematic vertical cross-sectional view of the exemplary structure after formation of memory openings and support openings according to an embodiment of the present disclosure.
Figure 10B:
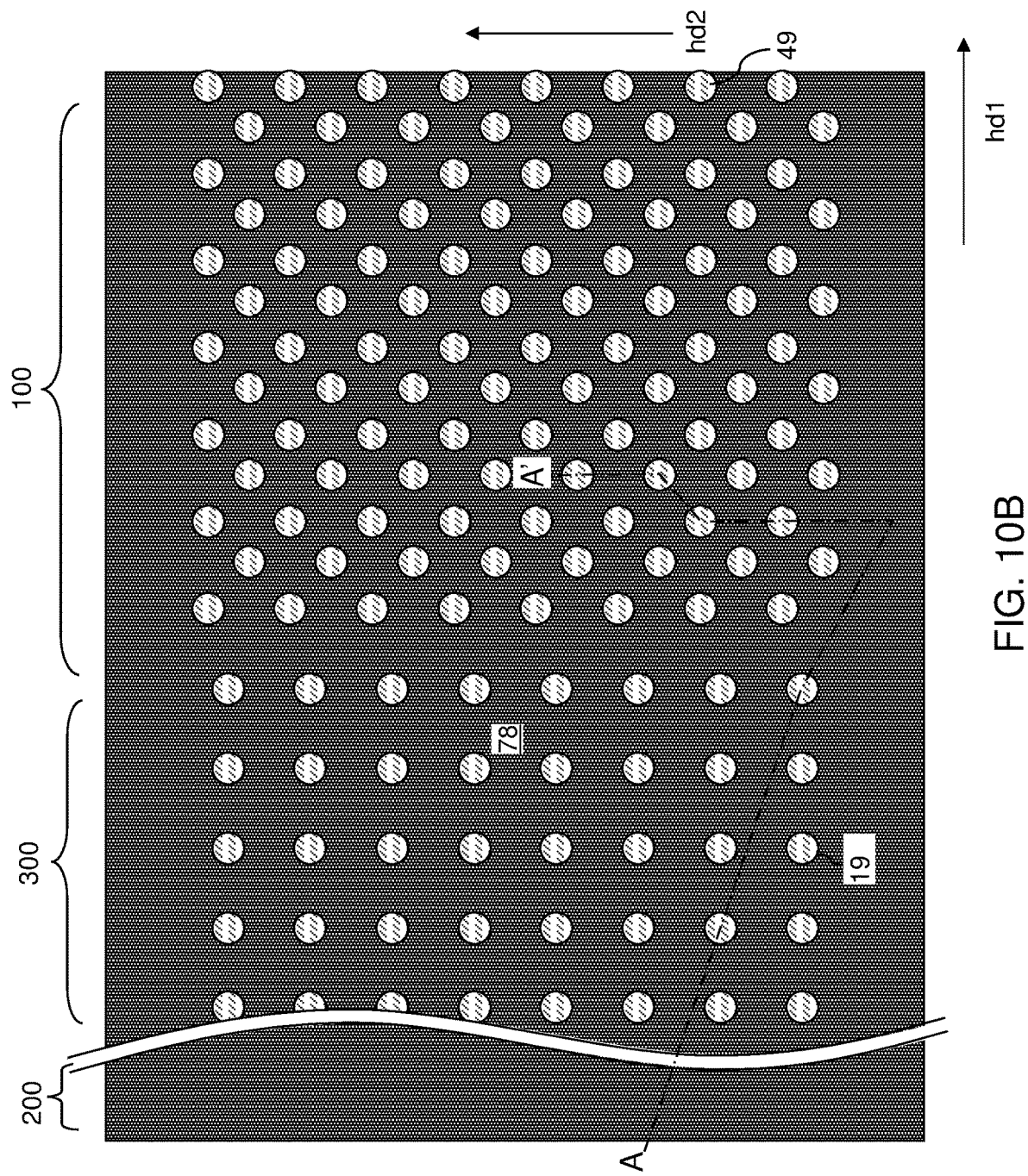
FIG. 10B is a top-down view of the exemplary structure of FIG. 10A. The vertical plane A-A' is the plane of the cross-section for FIG. 10A.

Referring to FIGS. 10A and 10B, a second anisotropic etch process can be performed employing the patterned hard mask layer 78 as an etch mask for the second anisotropic etch process. The pattern of openings in the patterned hard mask layer 78 is transferred through the word-line-level sacrificial material layers 42 and the word-line-level insulating layers 32. Memory openings 49 and the support openings 19 can be formed. The memory openings 49 can be formed by vertically extending the drain-select-level memory openings 149, and can vertically extend through the at least one drain-select-level electrically conductive layer 346, the word-line-level sacrificial material layers 42, and the word-line-level insulating layers 32. The support openings 19 can be formed by vertically extending the drain-select-level support openings 119, and can vertically extend through the retro-stepped dielectric material portion 65, the at least one drain-select-level electrically conductive layer 346, the word-line-level sacrificial material layers 42, and the word-line-level insulating layers 32. Thus, the memory openings 49 are self-aligned to the drain-select-level memory openings 149, and a separate photolithography step is not required to form the memory openings 49. This avoids photolithography errors and resulting misalignment between the drain-select-level memory openings 149 and the portions of the memory openings 49 extending through the word-line-level sacrificial material layers 42, and the word-line-level insulating layers 32.

The memory openings 49 are formed through each layer of the alternating stack (32, 42, 332, 342, 70) in the memory array region 100. The support openings 19 are formed through the retro-stepped dielectric material portion 65 and the portion of the alternating stack (32, 42, 332, 342, 70) that underlie the stepped surfaces in the staircase region 300. The memory openings 49 extend through the entirety of the alternating stack (32, 42, 332, 342, 70). The support openings 19 extend through a subset of layers within the alternating stack (32, 42, 332, 342, 70). The chemistry of the second anisotropic etch process used to etch through the materials of the alternating stack (32, 42, 332, 342, 70) can alternate to optimize etching of the first and second materials in the alternating stack (32, 42, 332, 342, 70). The second anisotropic etch can be, for example, a series of reactive ion etches. The sidewalls of the memory openings 49 and the support openings 19 can be substantially vertical, or can be tapered.

The memory openings 49 and the support openings 19 can extend from the top surface of the alternating stack (32, 42, 332, 342, 70) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 11A:
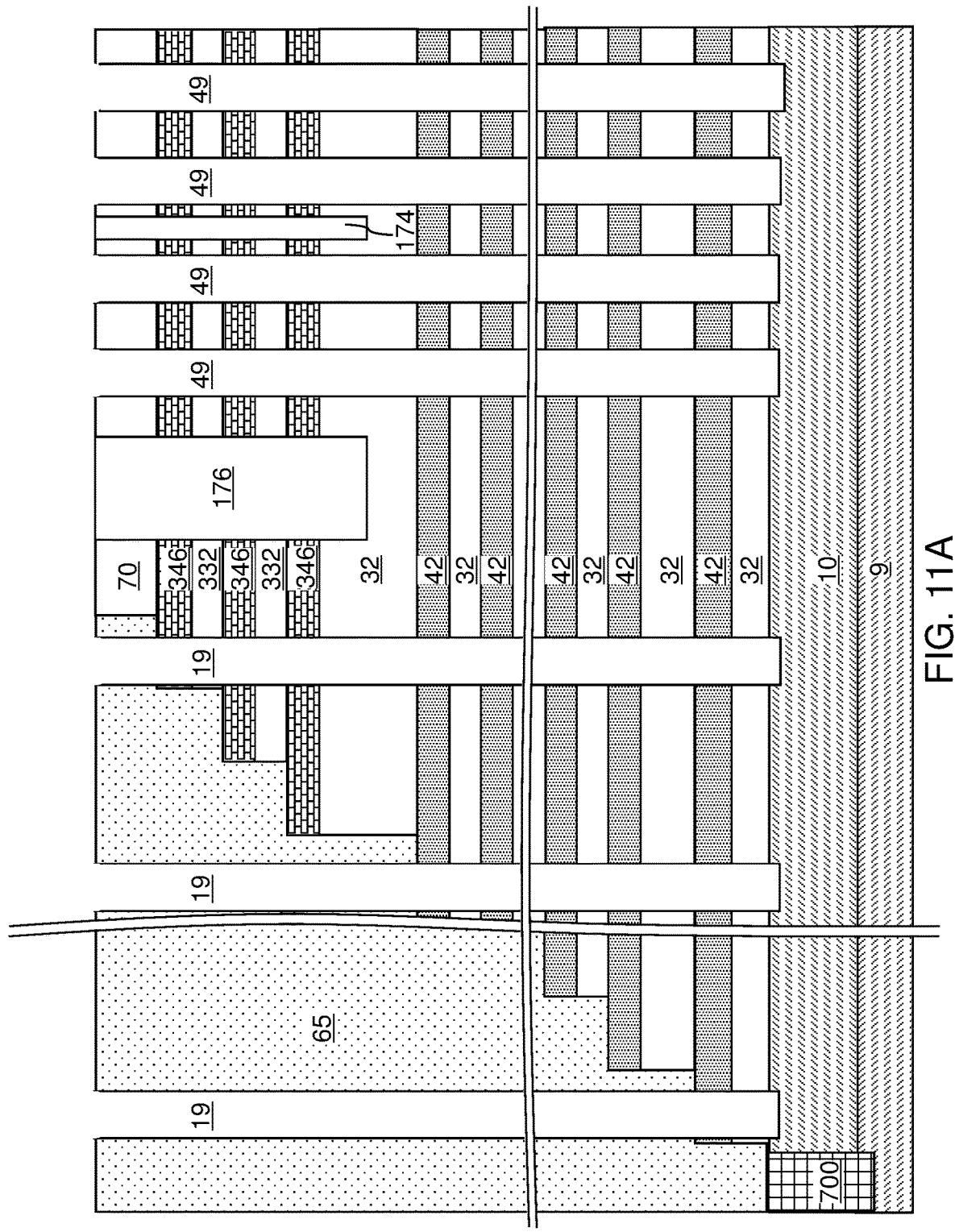
FIG. 11A is a schematic vertical cross-sectional view of the exemplary structure after removal of the patterned hard mask layer according to an embodiment of the present disclosure.
Figure 11B:
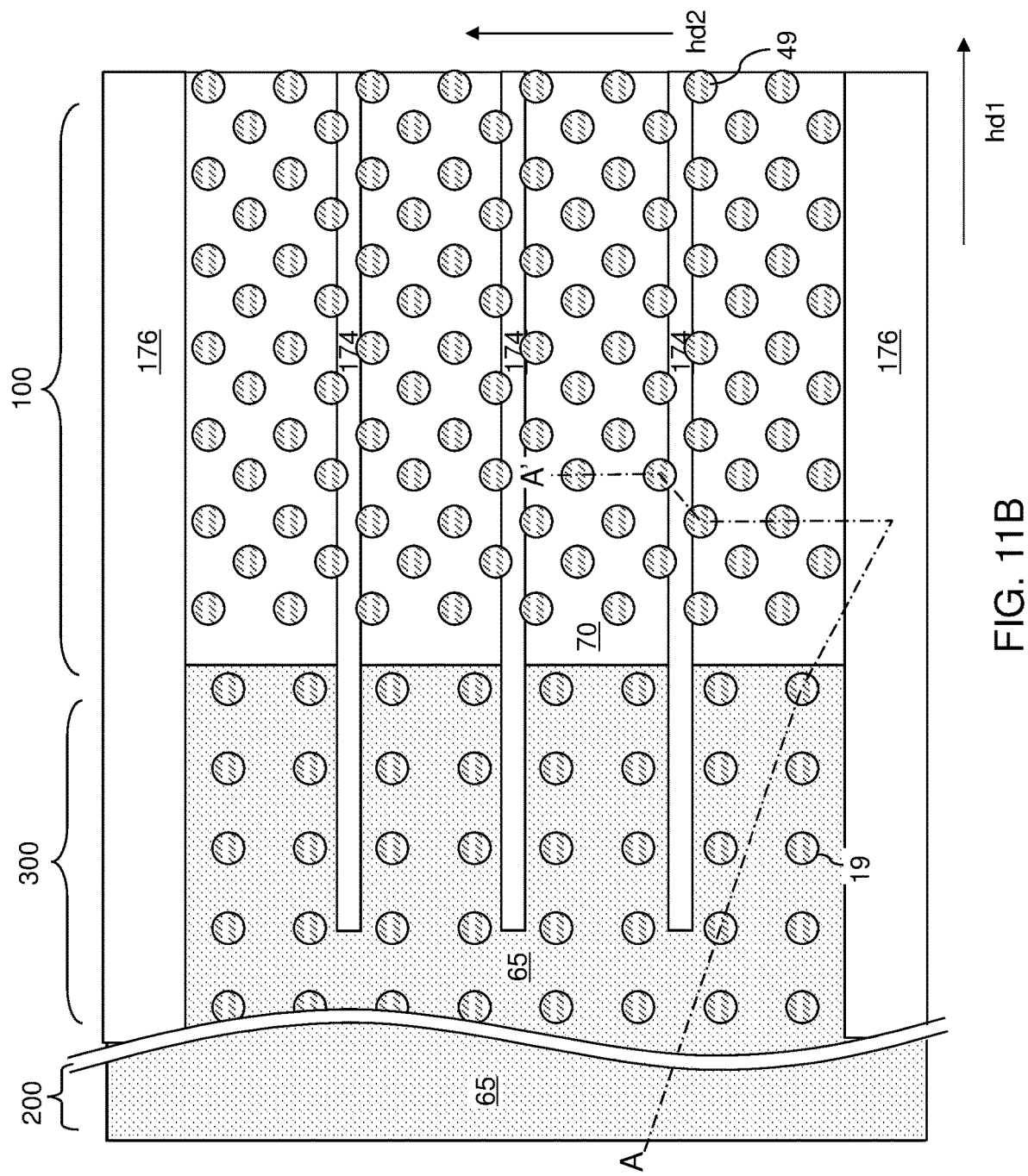
FIG. 11B is a top-down view of the exemplary structure of FIG. 11A. The vertical plane A-A' is the plane of the cross-section for FIG. 11A.

Referring to FIGS. 11A and 11B, the patterned hard mask layer 78 can be removed. In case the patterned hard mask layer 78 comprises a carbon-based material such as amorphous carbon or diamond-like carbon, the patterned hard mask layer 78 can be removed by ashing. Otherwise, selective etching may be used.

FIGS. 12A-12H are sequential schematic vertical cross-sectional views of a memory opening 49 within the exemplary structure during formation of a memory opening fill structure 58 according to an embodiment of the present disclosure.

Referring to FIG. 12A, a memory opening 49 in the exemplary device structure of FIGS. 11A and 11B is illustrated. The memory opening 49 extends through the insulating layers (32, 332, 70), the at least one drain-select-level electrically conductive layer 346, and the word-line-level sacrificial material layers 42, and optionally into an upper portion of the semiconductor material layer 10. At this processing step, each support opening 19 can extend through the retro-stepped dielectric material portion 65, and through a respective subset of the at least one drain-select-level electrically conductive layer 346 and the word-line-level sacrificial material layers 42, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the word-line-level sacrificial material layers 42 can be laterally recessed partially to form lateral recesses (not shown), for example, by an isotropic etch.

Referring to FIG. 12B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a word-line-level sacrificial material layer 42. In this case, at least one source select gate electrode can be subsequently formed by replacing each word-line-level sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 12C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. The thickness of the blocking dielectric layer 52 can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. For example, the memory material layer 54 may include a charge storage material such as silicon nitride, polysilicon, or a metallic material, a ferroelectric material that can store information in the form of a ferroelectric polarization direction, or any other memory material that can store data by altering electrical resistivity properties.

The dielectric material liner 56 includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 12D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the word-line-level sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601.

Referring to FIG. 12E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 12F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 12H:
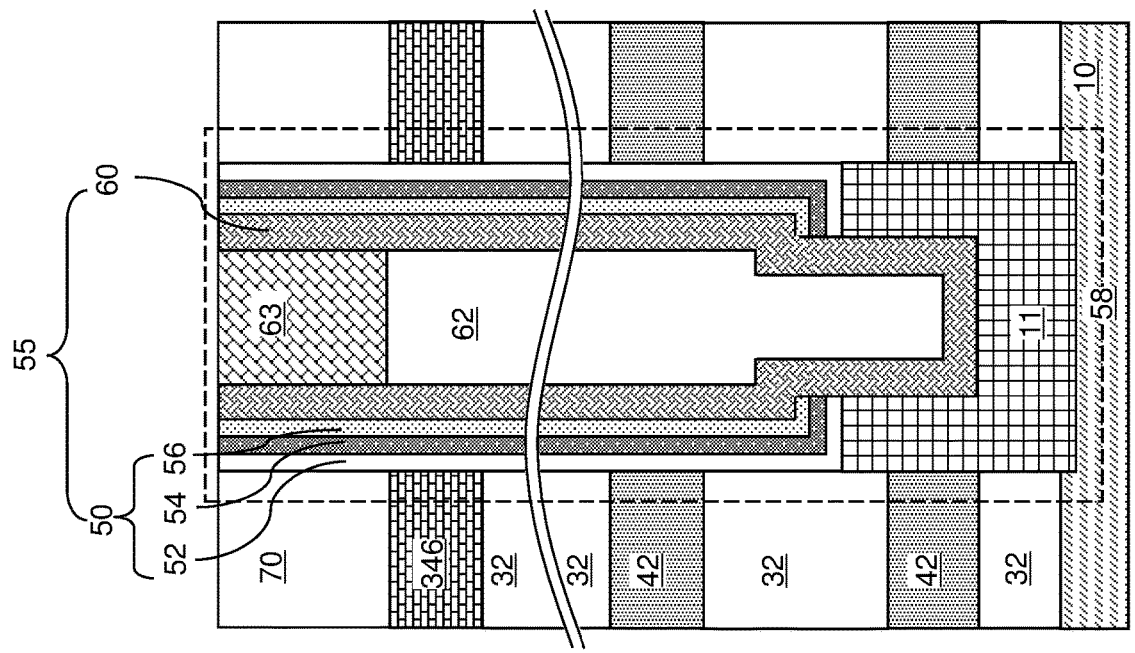
Figure 12G:
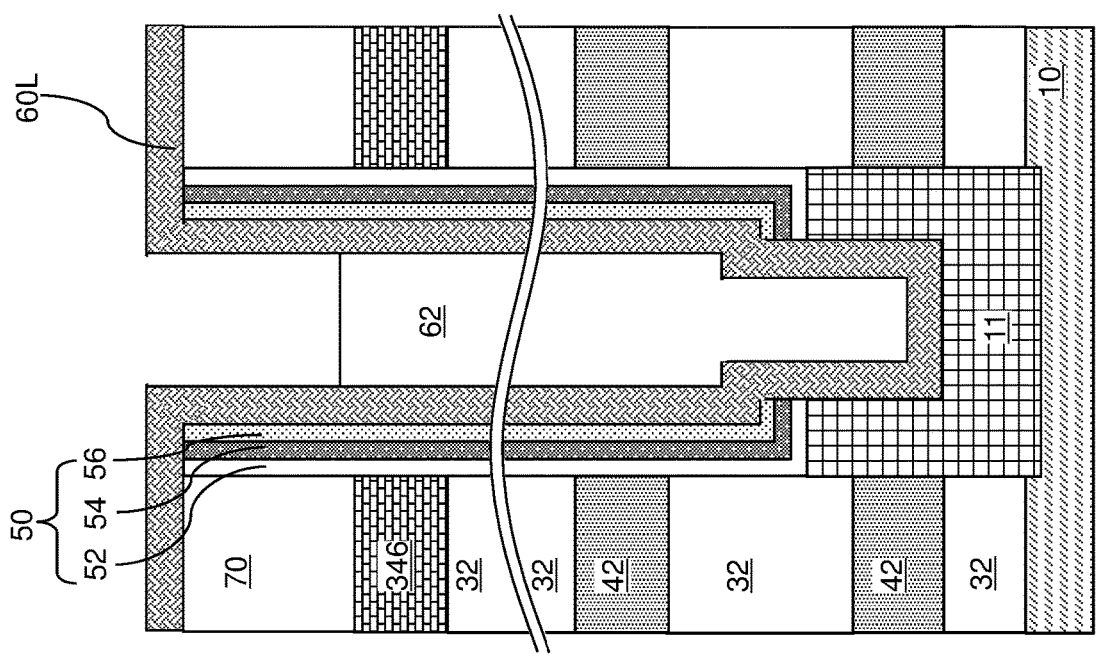

Referring to FIG. 12G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 12H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the word-line-level sacrificial material layers 42. In case a dielectric material liner 56 is present in each memory opening fill structure 58, the dielectric material liner 56 may be formed on the vertical stack of memory elements. In one embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer 54 and the tunneling dielectric layer 56 can be located between the charge storage layer 54 and the vertical semiconductor channel 60. A vertical NAND string can be formed through each memory opening upon subsequent replacement of the word-line-level sacrificial material layers 42 with electrically conductive layers.

Figure 13A:
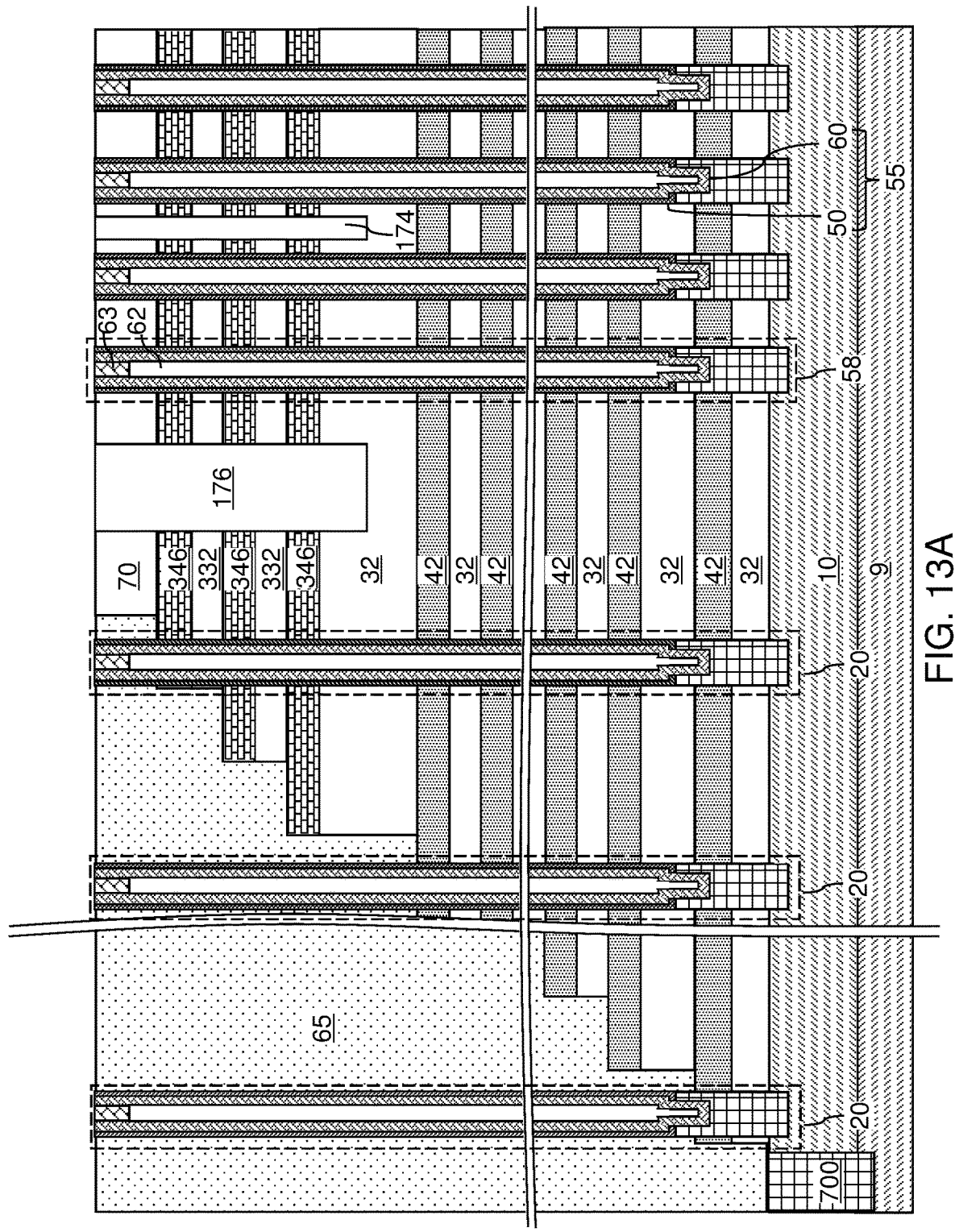
FIG. 13A is a schematic vertical cross-sectional view of the exemplary structure after formation of memory opening fill structures and support pillar structures according to an embodiment of the present disclosure.
Figure 13B:
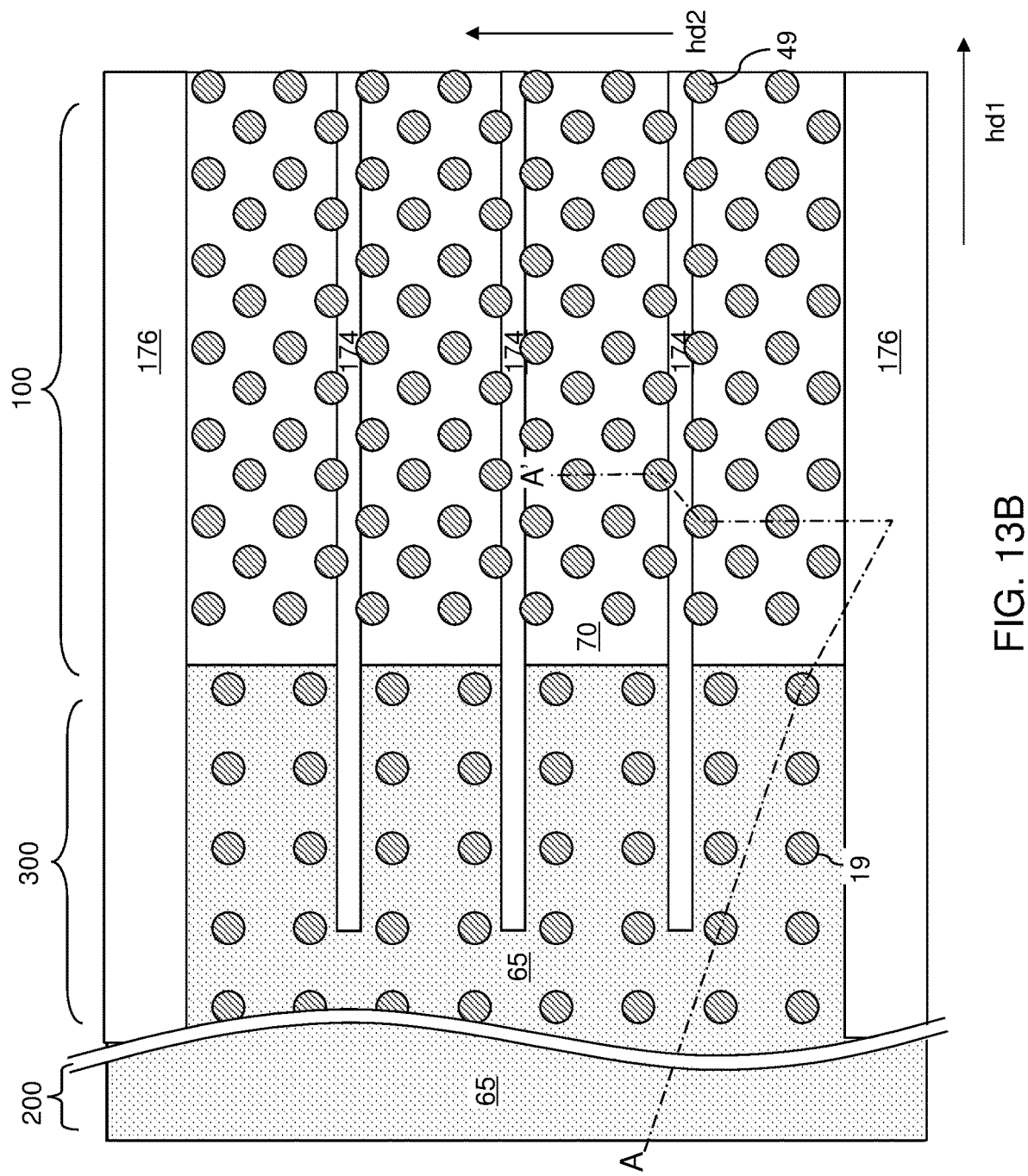
FIG. 13B is a top-down view of the exemplary structure of FIG. 13A. The vertical plane A-A' is the plane of the cross-section for FIG. 13A.

Referring to FIGS. 13A and 13B, the exemplary structure is illustrated after formation of memory opening fill structures 58 and support pillar structures 20 within the memory openings 49 and the support openings 19, respectively. An instance of a memory opening fill structure 58 can be formed within each memory opening 49 of the structure of FIGS. 11A and 11B. According to an aspect of the present disclosure, each of the memory opening fill structures 58 can be formed directly on at least one cylindrical surface of the at least one drain-select-level electrically conductive layer 346 and directly on a plurality of cylindrical surfaces of the word-line-level sacrificial material layers 42. An instance of the support pillar structure 20 can be formed within each support opening 19 of the structure of FIGS. 11A and 11B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising portions of the memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 14A:
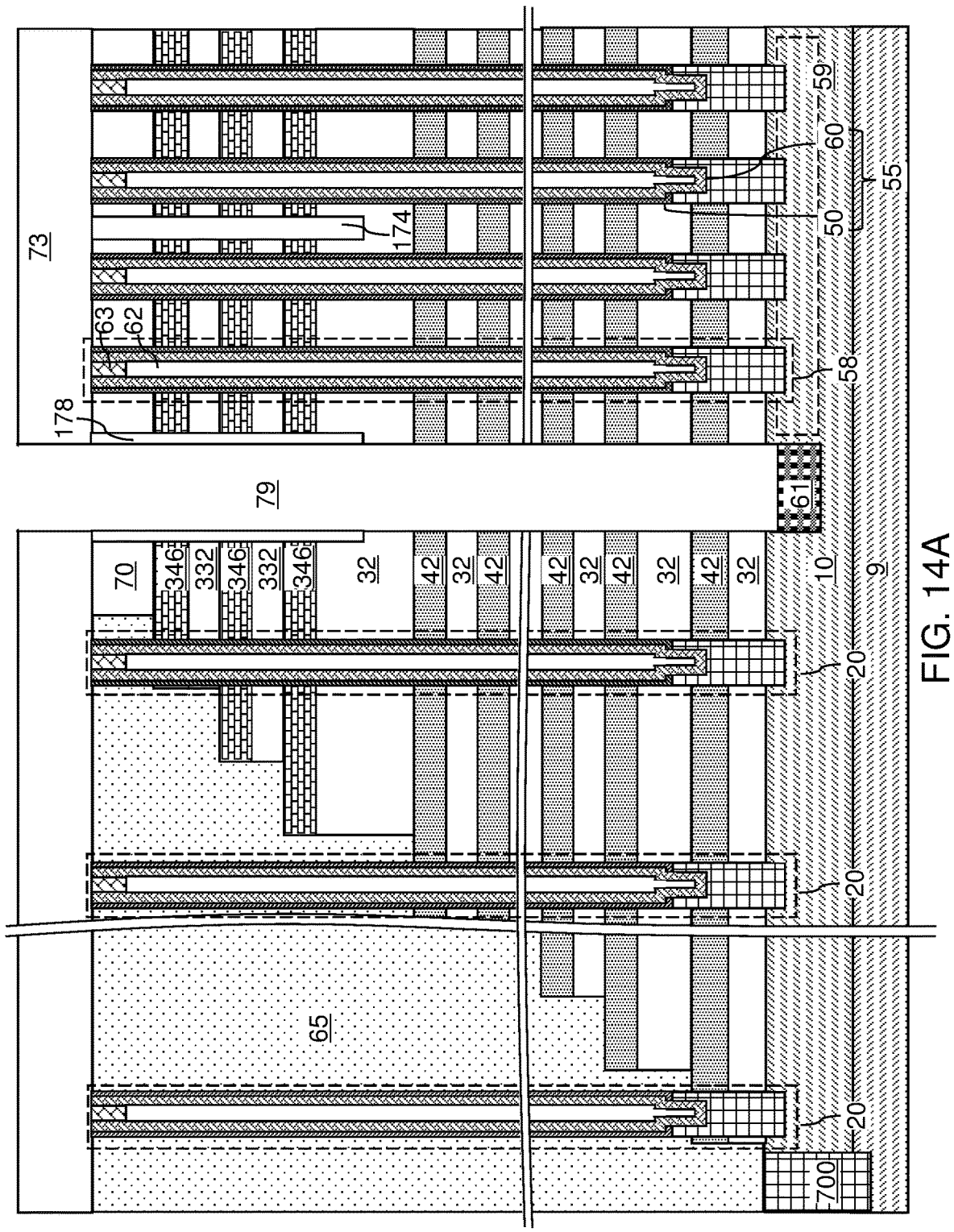
FIG. 14A is a schematic vertical cross-sectional view of the exemplary structure after formation of a contact-level dielectric layer and backside trenches according to an embodiment of the present disclosure.
Figure 14B:
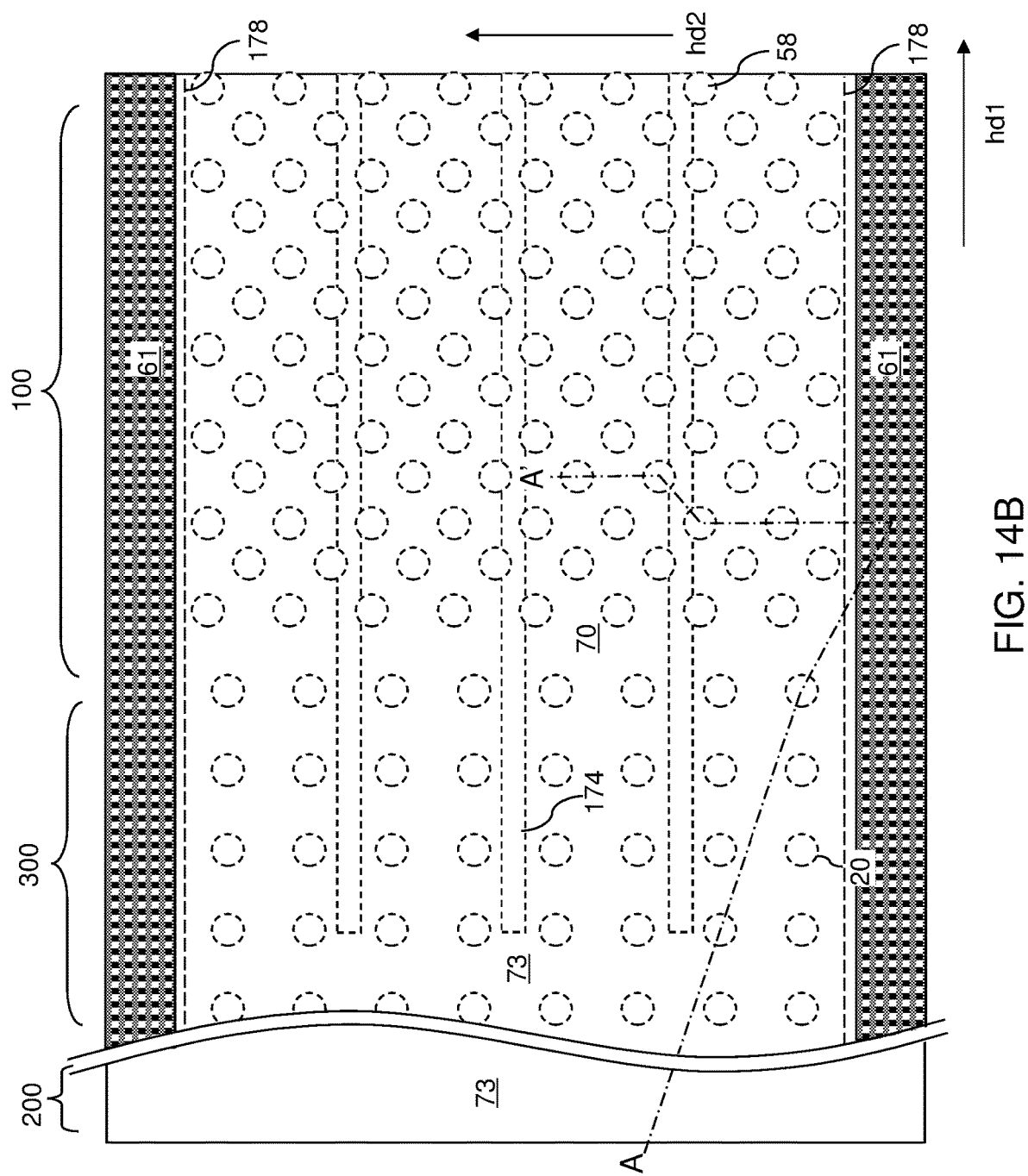
FIG. 14B is a top-down view of the exemplary structure of FIG. 14A. The vertical plane A-A' is the plane of the cross-section for FIG. 14A.

Referring to FIGS. 14A and 14B, a contact-level dielectric layer 73 can be formed over the insulating cap layer 70 and the retro-stepped dielectric material portion 65. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas located entirely within the area of a respective one of the drain-select-level dielectric rails 176. In one embodiment, each opening in the photoresist layer may have a respective horizontal cross-sectional view of a rectangle having a pair of lengthwise edges that are laterally offset inward from lengthwise sidewalls of an underlying drain-select-level dielectric rail 176. The pattern in the photoresist layer can be transferred through the contact-level dielectric layer 73, the drain-select-level dielectric rails 176, and an alternating stack of word-line-level insulating layers 32 and word-line-level sacrificial material layers 42, and the retro-stepped dielectric material portion 65 employing an anisotropic etch to form backside trenches 79. The backside trenches 79 vertically extend from the top surface of the contact-level dielectric layer 73 at least to the top surface of the substrate (9, 10), and laterally extend through the memory array region 100 and the staircase region 300.

In one embodiment, the backside trenches 79 can be formed through the drain-select-level dielectric rails 176 and through the word-line-level sacrificial material layers 42. Each of the drain-select-level dielectric rails 176 can be divided into a respective pair of drain-select-level dielectric spacers 178 that are laterally spaced from each other by a respective one of the backside trenches 79. Each of the drain-select-level dielectric spacers 178 can have a respective pair of lengthwise sidewalls that laterally extend along the first horizontal direction hd1.

Each alternating stack of word-line-level insulating layers 32 and word-line-level sacrificial material layers 42 can be formed within a respective pair of backside trenches 79. Each of the backside trenches 79 may be laterally spaced from a plurality of drain-select-level electrically conductive layers 346 by a respective drain-select-level dielectric spacer 178. Sidewalls of a pair of drain-select-level dielectric spacers 178 may be physically exposed to a backside trench 79.

In one embodiment, the backside trenches 79 can laterally extend along a first horizontal direction hd1 and can be laterally spaced apart from each other along a second horizontal direction hd2 that is perpendicular to the first horizontal direction hd1. The memory stack structures 55 can be arranged in rows that extend along the first horizontal direction hd1. The drain-select-level isolation structures 174 can laterally extend along the first horizontal direction hd1. Each backside trench 79 can have a uniform width that is invariant along the lengthwise direction (i.e., along the first horizontal direction hd1). Each drain-select-level isolation structure 174 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 174, or between a neighboring pair of drain-select-level isolation structures 174. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 15:
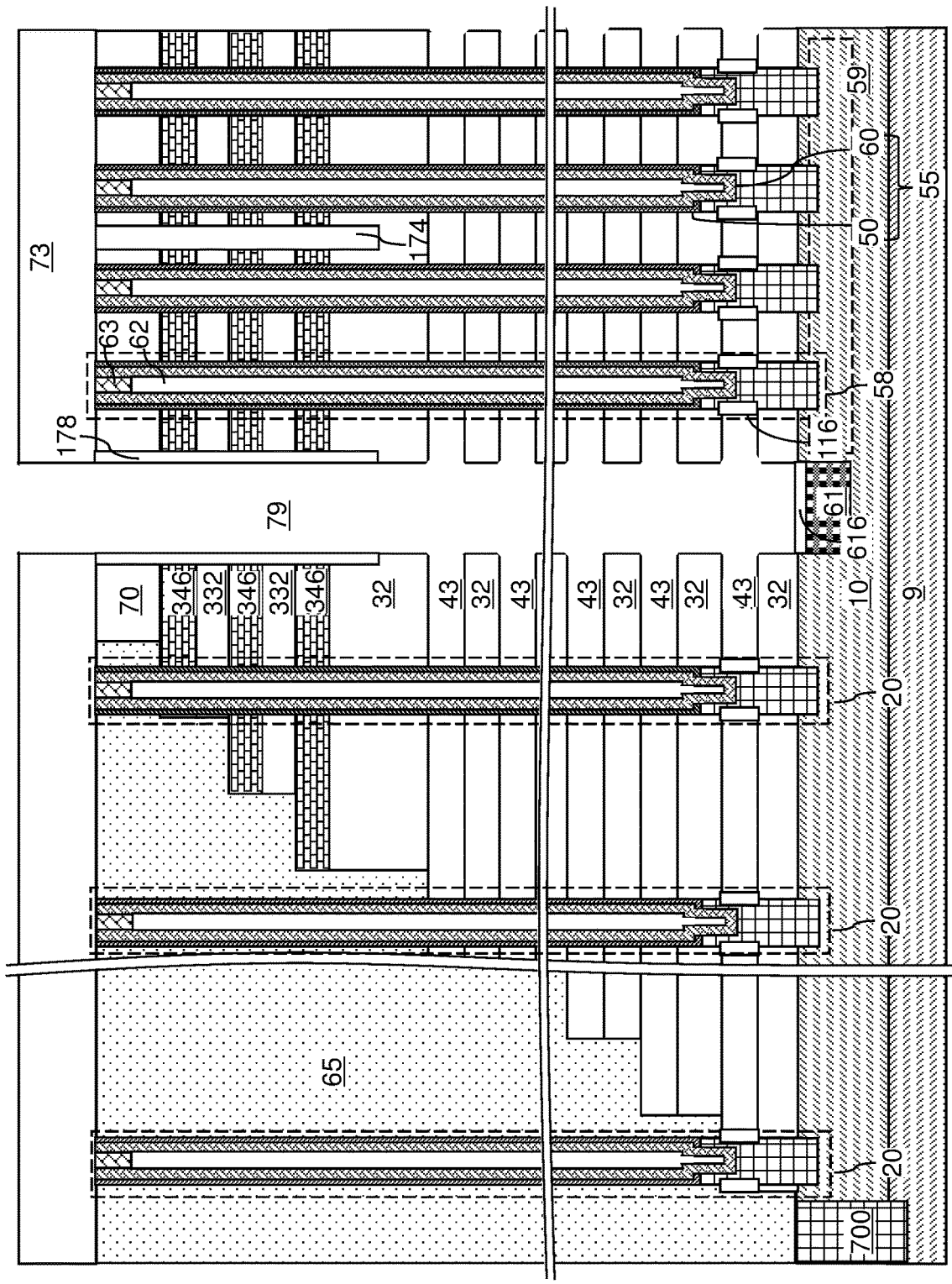
FIG. 15 is a schematic vertical cross-sectional view of the exemplary structure after formation of word-line-level cavities according to an embodiment of the present disclosure.

Referring to FIGS. 15 and 16A, an etchant that selectively etches the material of the word-line-level sacrificial material layers 42 can be introduced into the backside trenches 79 by performing a second selective isotropic etch process. The etchant can etch the material of the word-line-level sacrificial material layers 42 selective to the first materials of the insulating layers (32, 332, 70), the contact-level dielectric layer 73, the retro-stepped dielectric material portion 65, the drain-select-level isolation structures 174, the drain-select-level dielectric spacers 178, and the drain-select-level electrically conductive layers 346. Word-line-level cavities 43 are formed in volumes from which the word-line-level sacrificial material layers 42 are removed. The removal of the second material of the word-line-level sacrificial material layers 42 can be selective to the first material of the insulating layers (32, 332, 70), the material of the retro-stepped dielectric material portion 65, the semiconductor material of the semiconductor material layer 10, and the material of the outermost layer of the memory films 50. In one embodiment, the word-line-level sacrificial material layers 42 can include silicon nitride, and the materials of the insulating layers (32, 332, 70) and the retro-stepped dielectric material portion 65 can be selected from silicon oxide and dielectric metal oxides.

The second selective isotropic etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the word-line-level sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the word-line-level cavities 43 are present within volumes previously occupied by the word-line-level sacrificial material layers 42.

Each word-line-level cavity 43 can be a laterally extending cavity having a lateral dimension that is greater than the vertical extent of the cavity. In other words, the lateral dimension of each word-line-level cavity 43 can be greater than the height of the word-line-level cavity 43. A plurality of word-line-level cavities 43 can be formed in the volumes from which the second material of the word-line-level sacrificial material layers 42 is removed. The memory openings in which the memory stack structures 55 are formed are herein referred to as front side openings or front side cavities in contrast with the word-line-level cavities 43. In one embodiment, the memory array region 100 comprises an array of monolithic three-dimensional NAND strings having a plurality of device levels disposed above the substrate (9, 10). In this case, each word-line-level cavity 43 can define a space for receiving a respective word line of the array of monolithic three-dimensional NAND strings.

Each of the plurality of word-line-level cavities 43 can extend substantially parallel to the top surface of the substrate (9, 10). A word-line-level cavity 43 can be vertically bounded by a top surface of an underlying word-line-level insulating layer 32 and a bottom surface of an overlying word-line-level insulating layer 32. In one embodiment, each word-line-level cavity 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 16B, a backside blocking dielectric layer 44 can be optionally formed. The backside blocking dielectric layer 44, if present, comprises a dielectric material that functions as a control gate dielectric for the control gates to be subsequently formed in the word-line-level cavities 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the word-line-level cavities 43 and on a sidewall of the backside trench 79. The backside blocking dielectric layer 44 can be formed directly on horizontal surfaces of the insulating layers 32 and sidewalls of the memory stack structures 55 within the word-line-level cavities 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the word-line-level cavities 43, and a top surface of the planar dielectric portion 616. A backside cavity 79' is present within the portion of each backside trench 79 that is not filled with the backside blocking dielectric layer 44.

Referring to FIG. 16C, a metallic barrier layer 46A can be deposited in the word-line-level cavities 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIG. 16D, a metal fill material is deposited in the plurality of word-line-level cavities 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of word-line-level cavities 43, and a continuous electrically conductive layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive layer 46L includes a continuous portion of the metallic barrier layer 46A and a continuous portion of the metallic fill material layer 46B that are located in the backside trenches 79 or above the contact-level dielectric layer 73.

Each word-line-level sacrificial material layer 42 can be replaced with a word-line-level electrically conductive layer 46. A backside cavity 79' is present in the portion of each backside trench 79 that is not filled with the backside blocking dielectric layer 44 and the continuous electrically conductive layer 46L. A tubular dielectric spacer 116 laterally surrounds a pedestal channel portion 11. A bottommost word-line-level electrically conductive layer 46 laterally surrounds each tubular dielectric spacer 116 upon formation of the word-line-level electrically conductive layers 46.

Figure 17A:
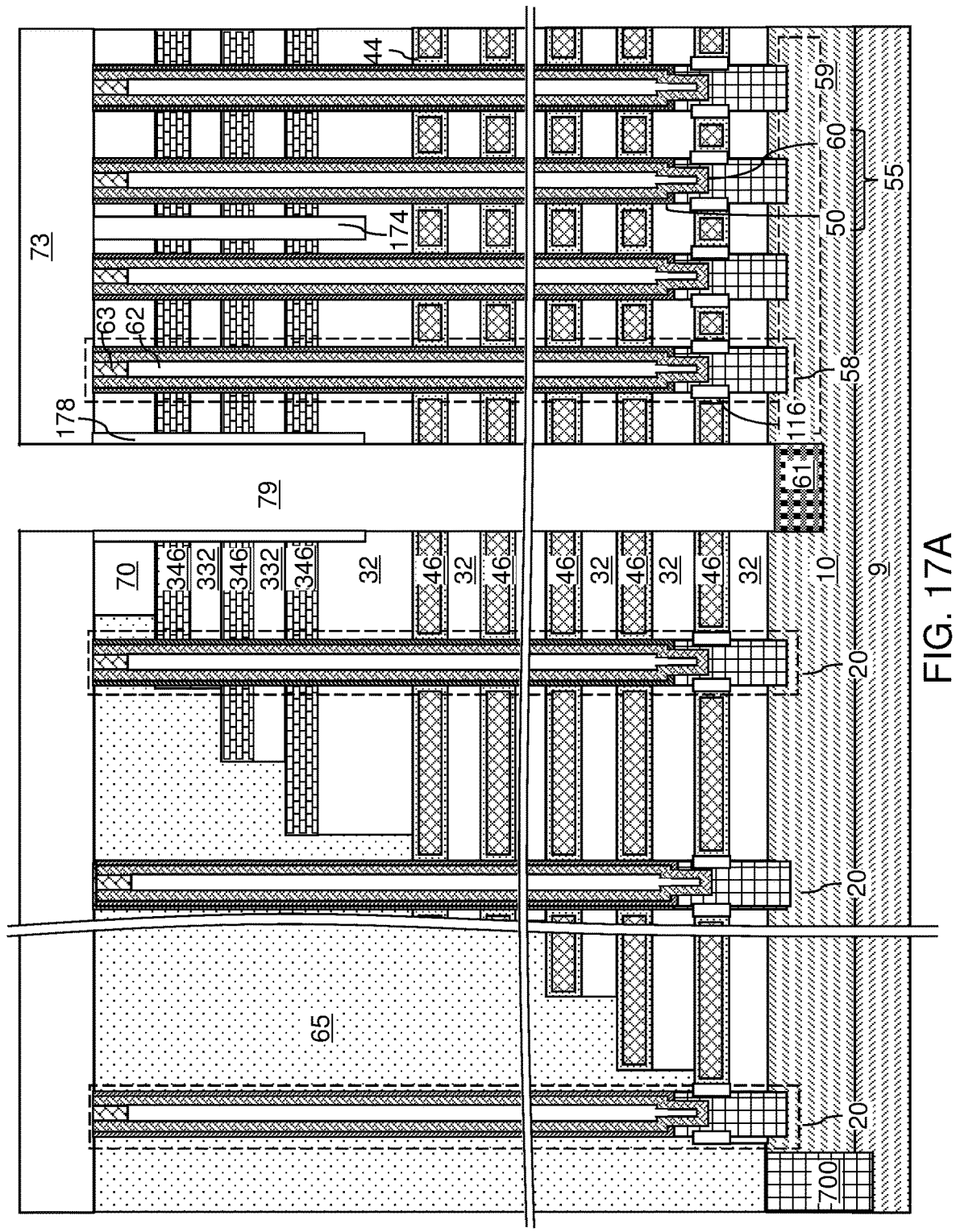
FIG. 17A is a schematic vertical cross-sectional view of the exemplary structure after removal of a deposited conductive material from within the backside trench according to an embodiment of the present disclosure.
Figure 17B:
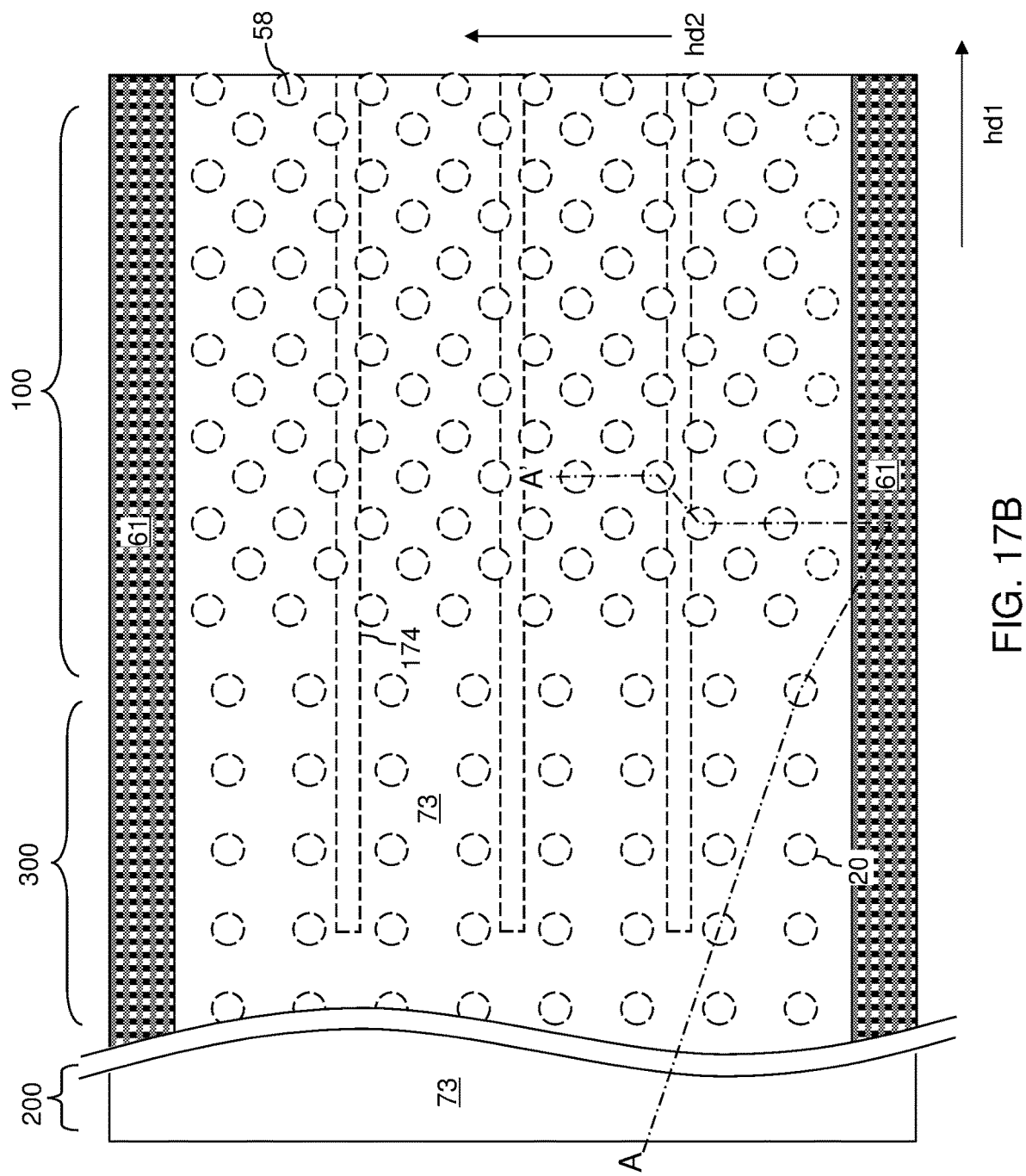
FIG. 17B is a top-down view of the exemplary structure of FIG. 17A. The vertical plane A-A' is the plane of the cross-section for FIG. 17A.

Referring to FIGS. 17A and 17B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the word-line-level cavities 43 constitutes an electrically conductive layer 46. Each word-line-level electrically conductive layer 46 can be a conductive line structure.

A subset of the word-line-level electrically conductive layers 46 can function as a combination of a plurality of control gate electrodes located at a same level and a word line electrically interconnecting, i.e., electrically shorting, the plurality of control gate electrodes located at the same level. The plurality of control gate electrodes within the subset of the word-line-level electrically conductive layers 46 can comprise the control gate electrodes for the vertical memory devices including the memory stack structures 55. In other words, the subset of the word-line-level electrically conductive layers 46 can comprise word lines that function as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

At least one bottommost word-line-level electrically conductive layer 46 provided upon formation of the electrically conductive layers 46 within the alternating stack (32, 46) can comprise a source side select gate electrode for the vertical NAND strings. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Generally, the word-line-level electrically conductive layers 46 can be formed in the word-line-level cavities 43 by conformally depositing at least one conductive material in the word-line-level cavities 43 employing at least one conformal deposition process that provides a respective reactant into the word-line-level cavities 43 through the backside trenches 79.

Figure 18A:
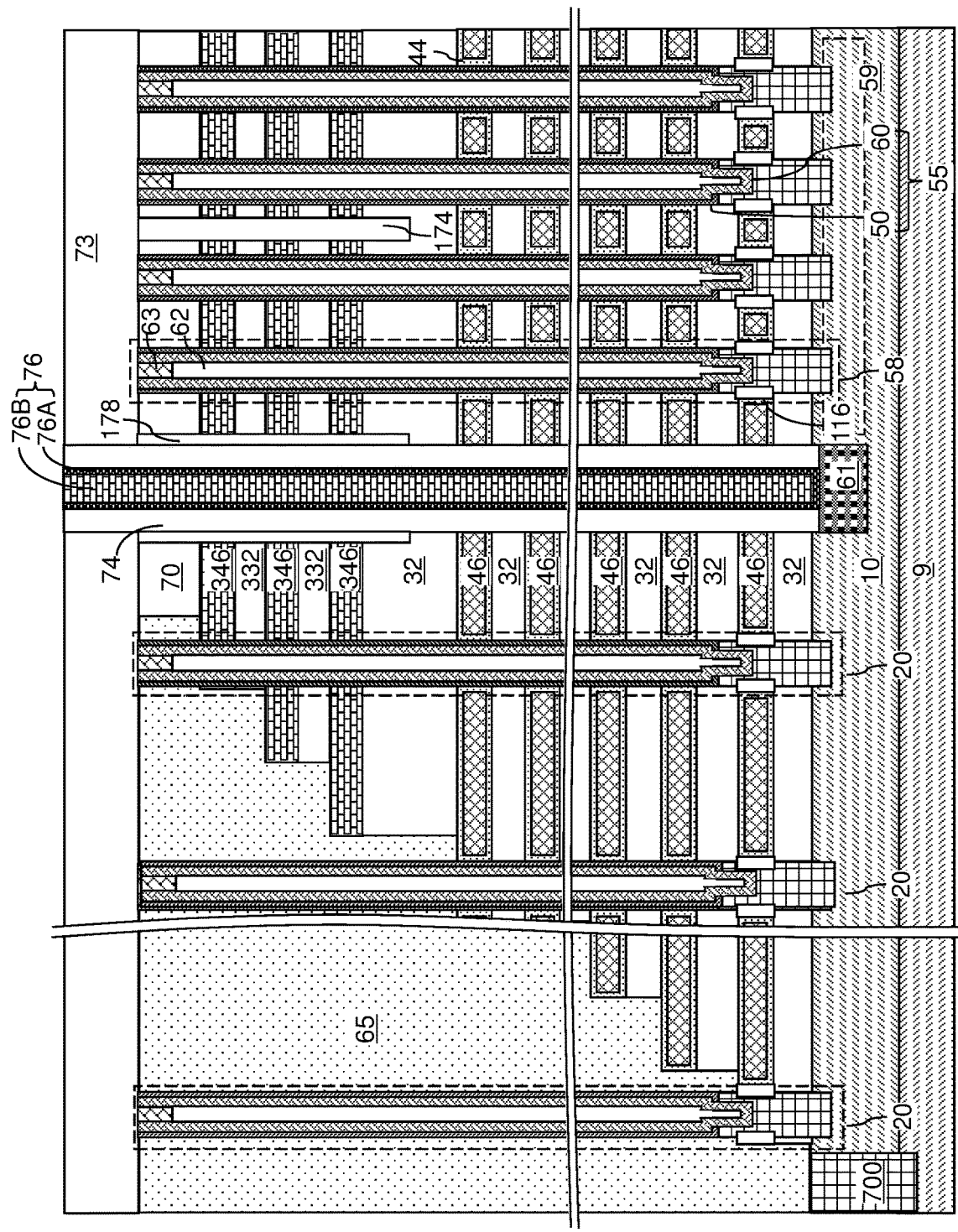
FIG. 18A is a schematic vertical cross-sectional view of the exemplary structure after formation of an insulating spacer and a backside contact structure in each backside trench according to an embodiment of the present disclosure.
Figure 18B:
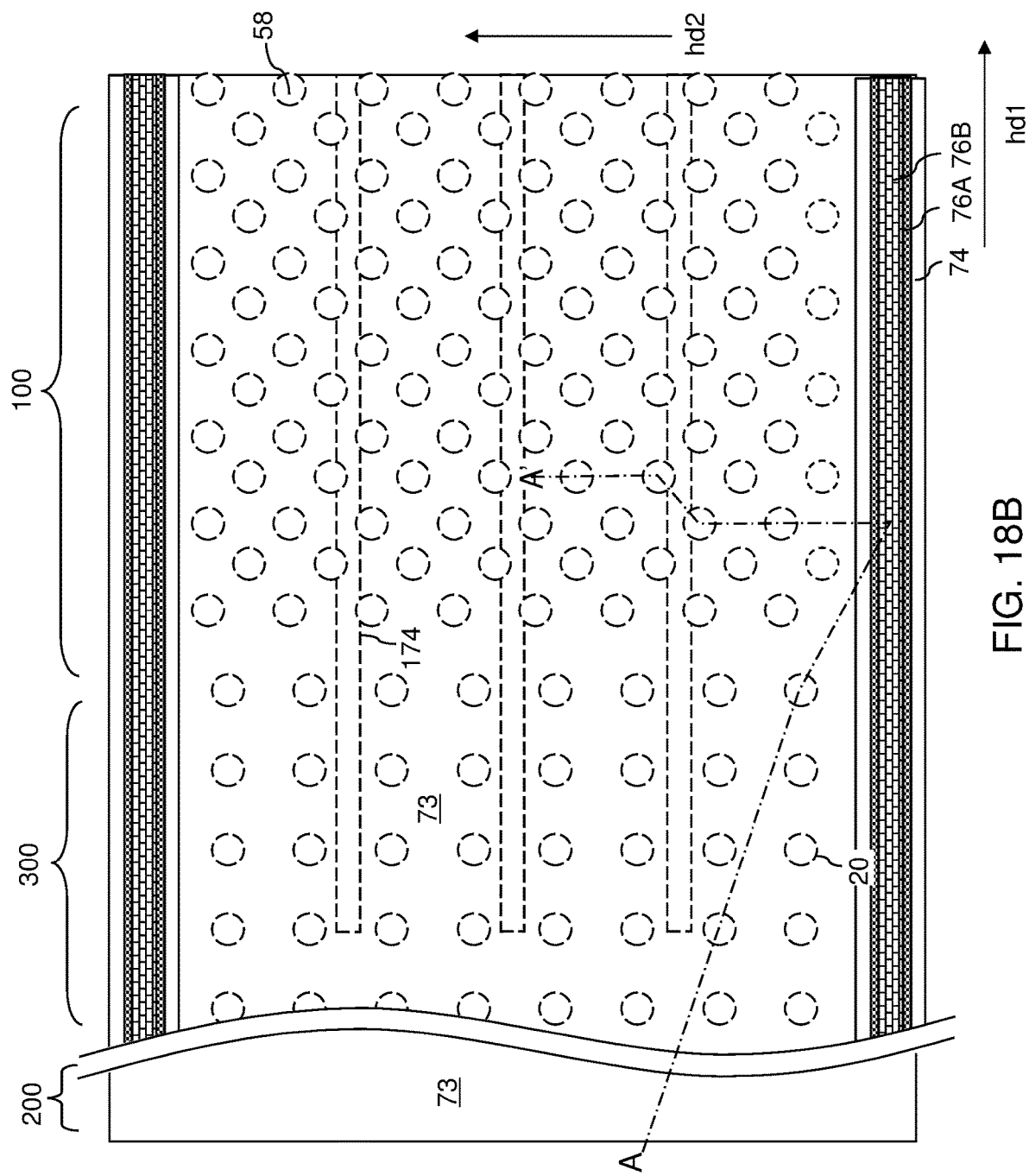
FIG. 18B is a magnified view of a region of the exemplary structure of FIG. 18A.

Referring to FIGS. 18A and 18B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Thus, a backside trench fill structure may comprise a dielectric material or a combination of backside contact via structure 76 located between insulating spacers 74. The width of the backside trench fill structure is the same at the levels of the drain-select-level electrically conductive layers 346 and the word-line-level electrically conductive layers 46 because the backside trench 79 is formed during a single etching step shown in FIGS. 17A and 17B. Thus, the chance of misalignment between upper and lower portions of the backside trench 79 is reduced or eliminated.

Figure 19A:
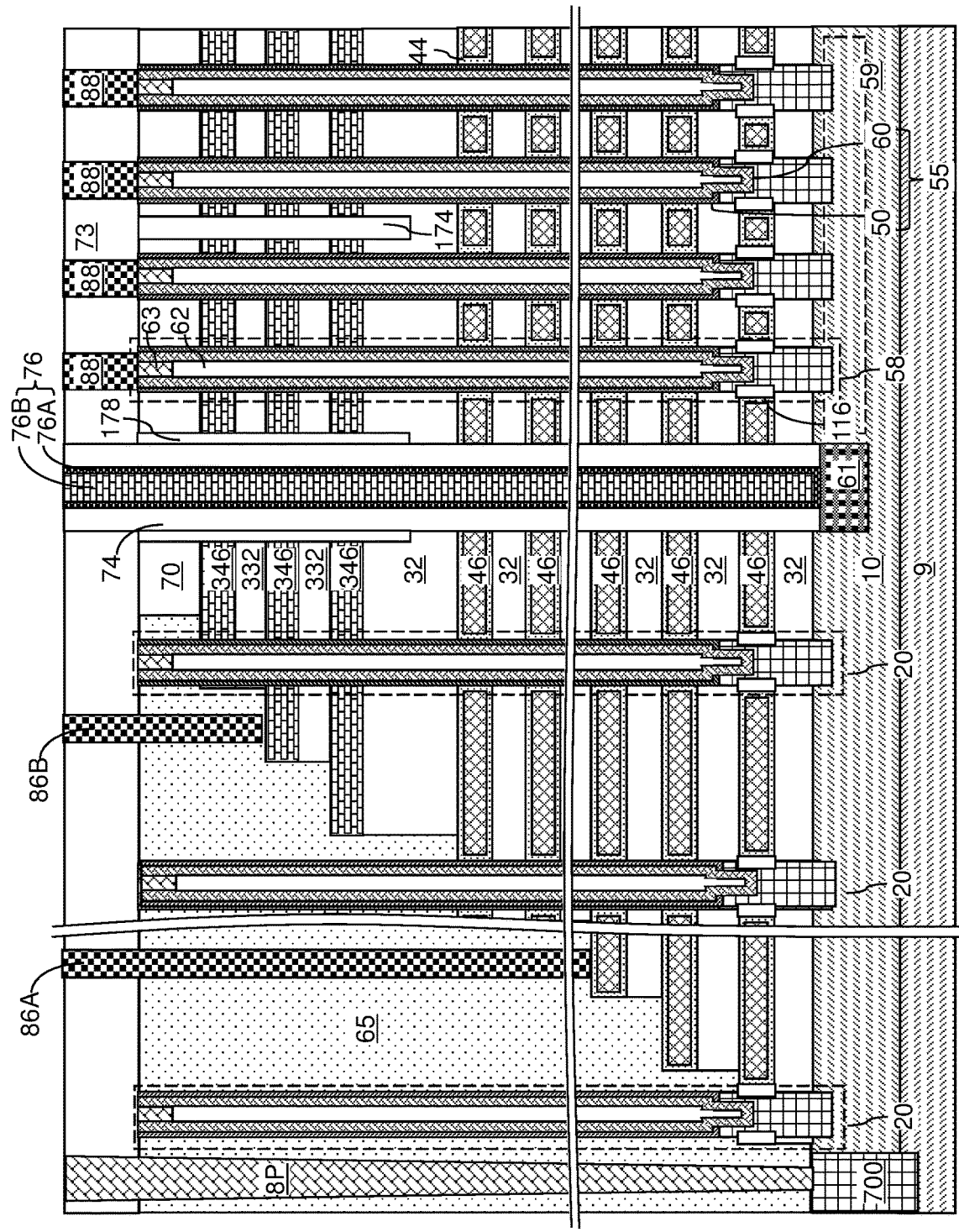
FIG. 19A is a schematic vertical cross-sectional view of the second exemplary structure after formation of additional contact via structures according to an embodiment of the present disclosure.
Figure 19B:
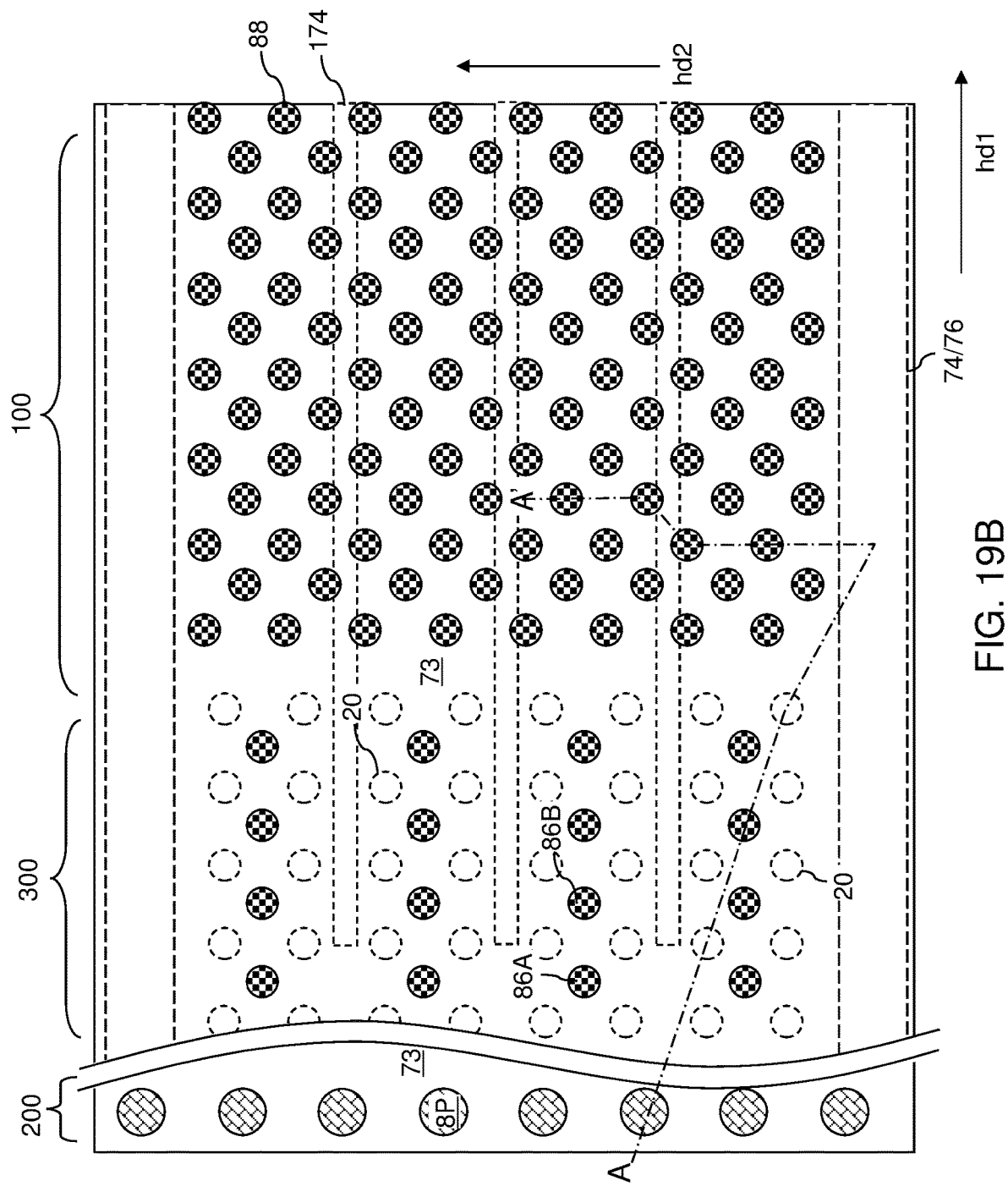
FIG. 19B is a top-down view of the second exemplary structure of FIG. 19A. The vertical plane A-A' is the plane of the schematic vertical cross-sectional view of FIG. 19A.

Referring to FIGS. 19A and 19B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a three-dimensional memory device is provided, which comprises: an alternating stack of insulating layers (32, 332, 70) and electrically conductive layers (46, 346), wherein the electrically conductive layers (46, 346) comprise word-line-level electrically conductive layers 46 and a plurality of drain-select-level electrically conductive layers 346 (which may be vertically spaced among one another by the drain-select-level insulating layers 332) located over the word-line-level electrically conductive layers 46; memory openings 49 vertically extending through the alternating stack (32, 46, 332, 346, 70); memory opening fill structures 58 located within a respective one of the memory openings 49, wherein each of the memory opening fill structures 58 comprises a memory film 50 and a vertical semiconductor channel 60; a pair of backside trench fill structures (e.g., 74 or 74, 76) vertically extending through each layer within the alternating stack (32, 46, 332, 346, 70) and having a respective pair of lengthwise sidewalls that laterally extend along a first horizontal direction hd1, wherein a width of each of the backside trench fill structures is the same at levels of the drain-select-level electrically conductive layers 346 and at levels of the word-line-level electrically conductive layers 46; and drain-select-level dielectric spacers 178 in contact with the drain-select-level electrically conductive layers 346, overlying a horizontal plane including a top surface of a topmost one of the word-line-level electrically conductive layers 46, and in contact with a sidewall of a respective one of the backside trench fill structures (74, 76).

In one embodiment, each of the pair of backside trench fill structures (74, 76) is laterally spaced from the plurality of drain-select-level electrically conductive layers 346 by a respective drain-select-level dielectric spacer 178, and contacts a sidewall of the respective drain-select-level dielectric spacer 178.

In one embodiment, each of the pair of backside trench fill structures (74, 76) contacts a respective pair of drain-select-level dielectric spacers 178 among the drain-select-level dielectric spacers 178.

In one embodiment, the three-dimensional memory device comprises drain-select-level isolation structures 174 vertically extending through the plurality of drain-select-level electrically conductive layers 346, located between the pair of backside trench fill structures (74, 76), and having a bottom surface located above the horizontal plane including the top surface of the topmost one of the word-line-level electrically conductive layers 46. In one embodiment, the drain-select-level isolation structures 174 and the drain-select-level dielectric spacers 178 have a same dielectric material composition throughout.

In one embodiment, each of the plurality of drain-select-level electrically conductive layers 346 contacts horizontal surfaces of a pair of insulating layers (32, 332, 70) among the insulating layers (32, 332, 70). In one embodiment, each of the word-line-level electrically conductive layers 46 is vertically spaced from a respective pair of most proximal insulating layers (such as the word-line-level insulating layers 32) of the insulating layers (32, 332, 70) by a respective backside blocking dielectric layer 44.

In one embodiment, each of the memory opening fill structures 58 is in direct contact with each of the plurality of drain-select-level electrically conductive layers 346; and each of the memory opening fill structures 58 is laterally spaced from each of the word-line-level electrically conductive layers 46 by a tubular portion of a respective backside blocking dielectric layer 44.

In one embodiment, the lengthwise sidewalls of the backside trench fill structures (74, 76) vertically extend straight through each layer within the alternating stack (32, 46, 332, 346, 70); and the word-line-level electrically conductive layers 46 contact the pair of backside trench fill structures (74, 76).

In one embodiment, the exemplary structures can include a three-dimensional memory device. In one embodiment, the three-dimensional memory device comprises a three-dimensional NAND memory device. The various embodiments of the present disclosure can be employed to form a plurality of drain-select-level electrically conductive layers 346, such as three or more drain-select-level electrically conductive layers 346, that are laterally spaced from each other between a neighboring pair of backside trench fill structures (74, 76) at each drain-select-electrode level. Each neighboring pair of drain-select-level electrically conductive layers 346 located at a same drain-select-electrode level and between a neighboring pair of backside trench fill structures (74, 76) can be laterally spaced apart from each other by a respective drain-select-level isolation structure 174. Three or more drain-select-level electrically conductive layers 346 can be provided at a same drain-select-electrode level between a neighboring pair of backside trench fill structures (74, 76). Each of the three or more drain-select-level electrically conductive layers 346 can be located at the same drain-select-electrode level, i.e., can be located at a same vertical distance from the top surface of the substrate (9, 10). A plurality of drain-select-electrode levels can be provided. In this case, two or more drain-select-level electrically conductive layers 346 can be vertically spaced from each other by at least one drain-select-level insulating layer 332.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming an alternating stack of insulating layers and sacrificial material layers over a substrate, wherein the sacrificial material layers comprise word-line-level sacrificial material layers and at least one drain-selectlevel sacrificial material layer that overlies the word-line-level sacrificial material layers;
forming drain-select-level openings vertically extending through the at least one drain-select-level sacrificial material layer;
replacing the at least one drain-select-level sacrificial material layer with at least one drain-select-level electrically conductive layer;
forming memory openings vertically extending through the at least one drain-select-level electrically conductive layer and the word-line-level sacrificial material layers by vertically extending the drain-select-level openings;
forming memory opening fill structures within the memory openings, wherein each of the memory opening fill structures comprises a memory film and a vertical semiconductor channel;
replacing the word-line-level sacrificial material layers with word-line-level electrically conductive layers;
forming drain-select-level isolation trenches and drain-select-level backside trenches through the at least one drain-select-level sacrificial material layer; and
forming drain-select-level isolation structures and drain-select-level dielectric rails in the drain-select-level isolation trenches and the drain-select-level backside trenches, respectively,
wherein the drain-select-level openings comprise sets of multiple rows of drain-select-level openings, wherein each set of multiple rows of drain-select-level openings is formed between a respective neighboring pair of the drain-select-level isolation structures and the drain-select-level dielectric rails.

2. The method of claim 1, wherein:
each of the drain-select-level isolation structures and the drain-select-level dielectric rails has a respective bottom surface above a horizontal plane including a top surface of a topmost one of the word-line-level sacrificial material layers; and
each of the drain-select-level openings has a respective bottom surface located above the horizontal plane including the top surface of the topmost one of the word-line-level sacrificial material layers.

3. A method of forming a three-dimensional memory device, comprising:
forming an alternating stack of insulating layers and sacrificial material layers over a substrate, wherein the sacrificial material layers comprise word-line-level sacrificial material layers and at least one drain-select-level sacrificial material layer that overlies the word-line-level sacrificial material layers;
forming drain-select-level openings vertically extending through the at least one drain-select-level sacrificial material layer;
replacing the at least one drain-select-level sacrificial material layer with at least one drain-select-level electrically conductive layer;
forming memory openings vertically extending through the at least one drain-select-level electrically conductive layer and the word-line-level sacrificial material layers by vertically extending the drain-select-level openings;
forming memory opening fill structures within the memory openings, wherein each of the memory opening fill structures comprises a memory film and a vertical semiconductor channel;
replacing the word-line-level sacrificial material layers with word-line-level electrically conductive layers;
forming drain-select-level dielectric rails through the at least one drain-select-level sacrificial material layer prior to formation of the drain-select-level openings; and
forming backside trenches through the drain-select-level dielectric rails and through the word-line-level sacrificial material layers, wherein each of the drain-select-level dielectric rails is divided into a respective pair of drain-select-level dielectric spacers that are laterally spaced from each other by a respective one of the backside trenches.

4. The method of claim 3, further comprising:
forming word-line-level cavities by removing the word-line-level sacrificial material layers selective to the insulating layers after formation of the backside trenches; and
forming the word-line-level electrically conductive layers in the word-line-level cavities by depositing at least one conductive material in the word-line-level cavities.

5. The method of claim 4, wherein:
the word-line-level cavities are formed by performing an isotropic etch process that etches a material of the word-line-level sacrificial material layers selective to a material of the insulating layers; and
the word-line-level electrically conductive layers are formed by conformally depositing the at least one conductive material employing at least one conformal deposition process that provides a respective reactant into the word-line-level cavities through the backside trenches.

* * * * *